US 8,605,254 B2

(12) United States Patent
Bagheri et al.

(10) Patent No.: US 8,605,254 B2
(45) Date of Patent: Dec. 10, 2013

(54) CONSTRAINED OPTIMIZATION OF LITHOGRAPHIC SOURCE INTENSITIES UNDER CONTINGENT REQUIREMENTS

(75) Inventors: Saeed Bagheri, Yorktown Heights, NY (US); Kafai Lai, Hopewell Junction, NY (US); David O. S. Melville, New York, NY (US); Alan E. Rosenbluth, Yorktown Heights, NY (US); Kehan Tian, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 914 days.

(21) Appl. No.: 12/605,732

(22) Filed: Oct. 26, 2009

(65) Prior Publication Data

US 2011/0096313 A1    Apr. 28, 2011

(51) Int. Cl.
*G03B 27/54* (2006.01)
(52) U.S. Cl.
USPC ............................... 355/67; 355/77
(58) Field of Classification Search
USPC ............ 250/201.9, 548, 492.1; 353/34, 97; 355/40, 53, 55, 67, 69, 70, 77; 356/4.07, 360, 400, 401; 378/34, 35; 430/4, 5, 302, 310–312, 313, 314, 316; 716/132
See application file for complete search history.

(56) References Cited

U.S. PATENT DOCUMENTS

| | | | |
|---|---|---|---|
| 5,653,566 A | 8/1997 | Williams et al. | 414/462 |
| 5,680,588 A | 10/1997 | Gortych et al. | 395/500 |
| 7,057,709 B2 | 6/2006 | Rosenbluth | 355/69 |
| 7,444,200 B1 * | 10/2008 | Qu et al. | 700/121 |
| 2005/0168498 A1 * | 8/2005 | Granik | 345/698 |
| 2005/0177810 A1 | 8/2005 | Heng et al. | 716/21 |
| 2009/0021718 A1 | 1/2009 | Melville et al. | 355/70 |

OTHER PUBLICATIONS

M. Burkhardt, A. Yen, C. Progler, and G. Wells, .Illuminator design for the printing of regular contact patterns,. Microelectronic Engineering 41-42 (1998): p. 91.
T.-S. Gau, R.-G. Liu, C.-K. Chen, C.-M. Lai, F.-J. Liang, and C.C. Hsia, .The Customized Illumination Aperture Filter for Low k1 Photolithography Process., SPIE v.4000—Optical Microlithography XIII (2000): p.271.
A.E. Rosenbluth, S. Bukofsky, C. Fonseca, M. Hibbs, K. Lai, A. Molless, R.N. Singh, and A.K. Wong,. Optimum Mask and Sourse Patterns to Print a Given Shape,. JM3 1, No. 1 (2002):p. 13.
A.E. Rosenbluth and N. Seong, .Global Optimization of the Illumination Distribution to Maximize Integrated Process Window,. SPIE v.6154 Optical Microlithography XIX (2006).

(Continued)

*Primary Examiner* — Toan Ton
*Assistant Examiner* — Mona M Sanei
(74) *Attorney, Agent, or Firm* — Harrington & Smith

(57) ABSTRACT

A method for illuminating a mask to project a desired image pattern into a photoactive material is described. The method includes receiving an image pattern. Determining a relationship between source pixels in a set of source pixels to desired intensities at one or more points in the image pattern is performed. Linear constraints are imposed on a set of intensity values based on one or more contingent intensity condition. The contingent intensity conditions include integer variables specifying contingent constraints. The method includes determining values of the set of intensity values in accordance with the linear constraints, using a constrained optimization algorithm. The set of intensity values represents intensities of a set of source pixels. The set of intensity values are output. Apparatus and computer readable storage media are also described.

16 Claims, 16 Drawing Sheets

(56) References Cited

OTHER PUBLICATIONS

R. Socha, M. Eurlings, F. Nowak, and J. Finders, .Illumination optimization of periodic patterns for maximum process window,. Microelectronic Engineering 61-62 (2002): p. 57.

R. Socha, X. Shi, and D. LeHoty, .Simultaneous Source Mask Optimization (SMO),. SPIE v.5853—Photomask and Next-Generation Lithography Mask Technology XII (2005): p. 180.

A.K. Wong, R. Ferguson, S. Mansfield, A. Molless, D. Samuels, R. Schuster, and A. Thomas, .Level-specific lithography optimization for 1-Gb DRAM,. IEEE Transactions on Semiconductor Manufacturing 13, No. 1 (Feb. 2000): p. 76.

A.E. Rosenbluth, D. Melville, K. Tian, K. Lai, N. Seong, D. Pfeiffer, and M. Colburn, .Global optimization of masks, including film stack design to restore TM contrast in high NA TCC's,. in SPIE v.6520—Optical Microlithography XX, ed. Donis G. Flagello (2007), p. 65200P.

R. Bixby and E. Rothberg, .Progress in computational mixed integer programming —A look back from the other side of the tipping point,. Annals of Operations Research 149 (2007): p. 37.

A.E. Rosenbluth, G. Gallatin, R.L. Gordon, W. Hinsberg, J. Hoffnagle, F. Houle, K. Lai, A. Lvov, M. Sanchez, And N. Seong, .Fast calculation of images for high numerical aperture lithography,. SPIE v.5377 Optical Microlithography XVII (2004): p. 615.

\* cited by examiner

Equation 1

Maximize$[\varphi(z_0, K_{Min}, K_{Max}; \vec{\vartheta})]$
w.r.t. $\vec{\vartheta}$
where objective $\varphi$ is defined by:

$$\varphi(z_0, K_{Min}, K_{Max}; \vec{\vartheta}) \equiv \sum_{k=K_{Min}}^{K_{Max}} (w'_k - w_k), \text{ subject to:}$$

a) $0 \leq \vartheta_j S_{Min} \leq S_{Max,j} \vec{\vartheta} \cdot \vec{p}$    ($\forall j | 1 \leq j \leq J_{Max}$)

b) $\vec{\vartheta} \cdot \vec{I}^t_{i[r,n]}(0, z_0) = 1$    ($\forall n, r | 1 \leq r \leq r_{Max,OPC}[n], 1 \leq n \leq n_{Max}$)

c) $\vec{\vartheta} \cdot \vec{I}^t_{i[u,n]}(0, z_0) \geq R^{(n)}_{Bright}$    ($\forall n, u | 1 \leq u \leq u_{Max}[n], 1 \leq n \leq n_{Max}$)

d) $\vec{\vartheta} \cdot \vec{I}^t_{i[v,n]}(0, z_0) \leq R^{(n)}_{Dark}$    ($\forall n, v | 1 \leq v \leq v_{Max}[n], 1 \leq n \leq n_{Max}$)

e) $w_k \geq \vec{\vartheta} \cdot \vec{I}^t_{i[r,n]}(CD_+, z_0 + k\Delta z)$    ($\forall r, n, k | 1 \leq r \leq r_{Max}[n], K_{Min} \leq k \leq K_{Max}, 1 \leq n \leq n_{Max}$)

f) $w'_0 \geq \vec{\vartheta} \cdot \vec{I}^t_{i[r,n]}(CD_+, z_0 + k\Delta z)$    ($\forall r, n, k | 1 \leq r \leq r_{Max}[n], K_{Min} \leq k \leq K_{Max}, 1 \leq n \leq n_{Max}$)

g) $w'_k \leq \vec{\vartheta} \cdot \vec{I}^t_{i[r,n]}(CD_-, z_0 + k\Delta z)$    ($\forall r, n, k | 1 \leq r \leq r_{Max}[n], K_{Min} \leq k \leq K_{Max}, 1 \leq n \leq n_{Max}$)

h) $w_0 \leq \vec{\vartheta} \cdot \vec{I}^t_{i[r,n]}(CD_-, z_0 + k\Delta z)$    ($\forall r, n, k | 1 \leq r \leq r_{Max}[n], K_{Min} \leq k \leq K_{Max}, 1 \leq n \leq n_{Max}$)

i) $w_k \geq w_{k-1}$    ($\forall k | 1 \leq k \leq K_{Max}$)

i') $w_k \leq w_{k-1}$    ($\forall k | K_{Min} + 1 \leq k \leq -1$)

j) $w'_k \leq w'_{k-1}$    ($\forall k | 1 \leq k \leq K_{Max}$)

j') $w'_k \geq w'_{k-1}$    ($\forall k | K_{Min} + 1 \leq k \leq -1$)

k) $w_k \leq w'_k$    ($\forall k | K_{Min} \leq k \leq K_{Max}$)

FIG. 8

Equation 2 m - scan)   $\mathscr{E}_j \neq 0$ $\Rightarrow$   $(\forall j | 1 \leq j \leq J_{Max})$ $|\{k | (\mathscr{E}_k \neq 0) \wedge (k \neq j)\}| \leq m - 1$

Equation 3

$$s_j = \mathscr{E}_j \operatorname*{Min}_k \left[ \frac{S_{Max,k}}{\mathscr{E}_k} \right]$$

Equation 4

$$E_i = \frac{1}{\vec{s} \cdot \vec{l}_i(x,z)}$$

Equation 5

$$\vec{l}' \equiv t^{(1)} \vec{l}/t^{(n)}$$

Equation 6

$m_1$)   $\mathscr{E}_j \leq S_{Max,j} E_{Max,j} {}^1b_j$   $(\forall j | 1 \leq j \leq J_{Max})$ $m_2$)   $\sum_{j=1}^{J_{Max}} {}^1b_j \leq m$

Equation 7

$m_3$)   $\mathscr{E}_j \geq \varepsilon_1 \frac{S_{Min} E_{Min}}{m} {}^1b_j$   $(\forall j | 1 \leq j \leq J_{Max})$

FIG. 9

Equation 8

$$\mathscr{E}_j \leq \underset{r,n}{\mathrm{Min}} \frac{1}{I'_{i[r,n],j}(0,z_0)} \quad (\forall n,r,j | 1 \leq r \leq r_{Max,OPC}[n], 1 \leq n \leq n_{Max}, 1 \leq j \leq J_{Max})$$

Equation 9

$$\mathscr{E}_j \leq \underset{r,n,CD_\pm}{\mathrm{Min}} \frac{L}{I'_{i[r,n],j}(CD_-, 0, CD_+; z_0)}$$

Equation 10

$$\mathscr{E}_j = \frac{s_j}{\vec{s} \cdot \vec{I'}} \leq s_j E_{Max} \leq S_{Max,j} E_{Max}$$

Equation 11

Minimize d,
w.r.t. $\vec{s}_h$
subject to:

$a_1$)  $\quad 0 \leq s_{h,j} \leq S_{Max,j}$  $\quad (\forall j | 1 \leq j \leq J_{Max})$ $a_2$)  $\quad \vec{s}_h \cdot \vec{p} \geq S_{Min}$ $l_1$)  $\quad d \geq \vec{s}_h \cdot \vec{I'}_r - \vec{s}_{DOE} \cdot \vec{I'}_{r,DOE}$  $\quad (\forall r | 1 \leq r \leq r_{Max}[h])$ $l_2$)  $\quad d \geq \vec{s}_{DOE} \cdot \vec{I'}_{r,DOE} - \vec{s}_h \cdot \vec{I'}_r$  $\quad (\forall r | 1 \leq r \leq r_{Max}[h])$ $m_1$)  $\quad s_{h,j} \leq S_{Max,j} {}^1 b_{h,j}$  $\quad (\forall j | 1 \leq j \leq J_{Max})$ $m_2$)  $\quad \sum_{j=1}^{J_{Max}} {}^1 b_{h,j} \leq m$

FIG. 10

Equation 12

$l'_1$)    $\vec{s}_{DOE} \cdot \vec{l}_{r,DOE} - \vec{s}_h \cdot \vec{l}_r + d \geq -E^2 b_{r,h}$      $(\forall r,h | 1 \leq r \leq r_{Max}, 1 \leq h \leq h_{Max})$ $l'_2$)    $\vec{s}_h \cdot \vec{l}_r - \vec{s}_{DOE} \cdot \vec{l}_{r,DOE} + d \geq -E^2 b_{r,h}$      $(\forall r,h | 1 \leq r \leq r_{Max}, 1 \leq h \leq h_{Max})$ $l'_3$)    $\sum_{h=1}^{h_{Max}} {}^2b_{r,h} = h_{Max} - 1$      $(\forall r | 1 \leq r \leq r_{Max})$

Equation 13

$n_1$)    $\vartheta_j p_j - \sum_{i=1}^{q_{Max}} \vartheta_{q(j,i)} \leq S_{Max,j} p_{Tol} E_{Max,j} (1 - {}^3b_j)$ $n_2$)    $\vartheta_j p_j - E_{Max,j} p_{Tol} \leq E_{Max,j} (S_{Max,j} p_j - p_{Tol})^3 b_j$      $(\forall j | 1 \leq j \leq J_{Max})$

Equation 14

$o_1$)    $\vartheta_{j,o} \leq S_{Max,j} E_{Max,j} {}^4 b_{j,o}$ $o_2$)    $\sum_{o=1}^{o_{Max}} {}^4 b_{j,o} \leq 1$      $(\forall j | 1 \leq j \leq J_{Max})$ $o_3$)    ${}^4 b_{j,o} = {}^4 b_{J_{Min}(R),o}$      $(\forall j, R, o | J_{Min}(R) + 1 \leq j \leq J_{Max}(R), 1 \leq o \leq o_{Max} - 1, 1 \leq R \leq R_{Max})$

Equation 15

$$\text{Maximize } \varphi(z_0, K_{Min}, K_{Max}, \vec{\vartheta}) \equiv \sum_{k=K_{Min}}^{K_{Max}} (w'_k - w_k) - E_{PW} {}^5 b$$

FIG. 11

Equation 16 c') $\vec{\vartheta} \cdot \vec{I'}_{i|[r,n]}(0,z_0) \geq R_{Bright}^{(n)}(1 - {}^5b) + \tilde{R}_{Bright}^{(n)} \, {}^5b$  $(\forall n, u | 1 \leq u \leq u_{Max}[n], 1 \leq n \leq n_{Max})$ d') $\vec{\vartheta} \cdot \vec{I'}_{i|[r,n]}(0,z_0) \leq R_{Dark}^{(n)}(1 - {}^5b) + \tilde{R}_{Dark}^{(n)} \, {}^5b$  $(\forall n, v | 1 \leq v \leq v_{Max}[n], 1 \leq n \leq n_{Max})$

Equation 17 b'$_1$) $\vec{\vartheta} \cdot \vec{I'}_{i|[r,n]}(0,k\Delta z) - 1 \geq -\tilde{R}_{Max}^{(n)}(1 - {}^6b_k^{(0)})$
$(\forall n,r,k | 1 \leq r \leq r_{Max,OPC}[n], 1 \leq n \leq n_{Max}, K'_{Min} \leq k \leq K'_{Max})$ b'$_2$) $\vec{\vartheta} \cdot \vec{I'}_{i|[r,n]}(0,k\Delta z) - 1 \leq \tilde{R}_{Max}^{(n)}(1 - {}^6b_k^{(0)})$
$(\forall n,r,k | 1 \leq r \leq r_{Max,OPC}[n], 1 \leq n \leq n_{Max}, K'_{Min} \leq k \leq K'_{Max})$ c') $\vec{\vartheta} \cdot \vec{I'}_{i|[u,n]}(0,k\Delta z) - R_{Bright}^{(n)} \geq -\tilde{R}_{Max}^{(n)}(1 - {}^6b_k^{(0)})$
$(\forall n,u,k | 1 \leq u \leq u_{Max}[n], 1 \leq n \leq n_{Max}, K'_{Min} \leq k \leq K'_{Max})$ d') $\vec{\vartheta} \cdot \vec{I'}_{i|[v,n]}(0,k\Delta z) - R_{Dark}^{(n)} \leq \tilde{R}_{Max}^{(n)}(1 - {}^6b_k^{(0)})$
$(\forall n,v,k | 1 \leq v \leq v_{Max}[n], 1 \leq n \leq n_{Max}, K'_{Min} \leq k \leq K'_{Max})$ p$_1$) $\sum_{k=K'_{Min}}^{K'_{Max}} {}^6b_k^{(0)} = 1$

Equation 18 p$_2$) ${}^6b_k^{(0,0)} - {}^6b_{k-1}^{(0,0)} = {}^6b_k^{(0)}$ p$_3$) ${}^6b_{K'_{Min}+1}^{(0,0)} \leq {}^6b_{K'_{Min}+1}^{(0)}$  $(\forall k | K'_{Min} + 2 \leq k \leq K'_{Max})$

FIG. 12

Equation 19

$p'_4$) $\quad {}^6b_k^{(+)} \leq {}^6b_{k-1}^{(+)}$ $\quad\quad (\forall k | K'_{Min} + 2 \leq k \leq K'_{Max})$ $p''_4$) $\quad {}^6b_{k-1}^{(-)} \leq {}^6b_k^{(-)}$ $\quad\quad (\forall k | K'_{Min} + 2 \leq k \leq K'_{Max})$ $p'_5$) $\quad {}^6b_k^{(+)} \leq {}^6b_k^{(0,0)}$ $\quad\quad (\forall k | K'_{Min} + 1 \leq k \leq K'_{Max})$ $p''_5$) $\quad {}^6b_k^{(-)} \leq (1 - {}^6b_k^{(0,0)})$ $\quad\quad (\forall k | K'_{Min} + 1 \leq k \leq K'_{Max})$ $p'_6$) $\quad \sum_{k=K'_{Min}}^{K'_{Max}} {}^6b_k^{(+)} = K_+$ $p''_6$) $\quad \sum_{k=K'_{Min}}^{K'_{Max}} {}^6b_k^{(-)} = K_-$

Equation 20

$e'$) $\quad w_k - \vec{\mathscr{A}} \cdot \vec{I'}_{i[r,n]}(CD+, z_0 + k\Delta z) \geq \widetilde{R}_{Max}^{(n)}({}^6b_k^{(+)} - 1)$ $\quad\quad (\forall r, n, k | 1 \leq r \leq r_{Max}[n], K_{Min} \leq k \leq K_{Max}, 1 \leq n \leq n_{Max})$ $e''$) $\quad w_k - \vec{\mathscr{A}} \cdot \vec{I'}_{i[r,n]}(CD+, z_0 + k\Delta z) \geq \widetilde{R}_{Max}^{(n)}({}^6b_k^{(-)} - 1)$ $\quad\quad (\forall r, n, k | 1 \leq r \leq r_{Max}[n], K_{Min} \leq k \leq K_{Max}, 1 \leq n \leq n_{Max})$ $i'$) $\quad w_k - w_{k-1} \geq \widetilde{R}_{Max}^{(n)}({}^6b_k^{(+)} - 1)$ $\quad\quad (\forall k | K_{Min} + 1 \leq k \leq K_{Max})$ $i''$) $\quad w_{k-1} - w_k \geq \widetilde{R}_{Max}^{(n)}({}^6b_k^{(-)} - 1)$ $\quad\quad (\forall k | K_{Min} + 1 \leq k \leq K_{Max})$ $p_7$) $\quad 0 \leq w_k \leq \widetilde{R}_{Max}^{(n)}({}^6b_k^{(+)} + {}^6b_k^{(-)})$ $\quad\quad (\forall k | K_{Min} + 1 \leq k \leq K_{Max})$

Equation 21

$q_1$) $\quad {}^7b'_h = {}^7b_e$

FIG. 13

Equation 22

$q_2$) $^7b'_h \leq {}^7b_{e_1}$ $q_3$) $^7b'_h \leq {}^7b_{e_2}$ $q_4$) $^7b'_h \geq {}^7b_{e_1} + {}^7b_{e_2} - 1$

Equation 23 e) $\vec{w}_k \cdot \vec{\mathcal{J}} \cdot \vec{I}_{i[r,n],h}(CD_+, z_0 + k\Delta z) \geq \widetilde{R}_{Max}^{(n)}({}^7b'_k - 1)$ $(\forall r,n,k | 1 \leq r \leq r_{Max}[n], K_{Min} \leq k \leq K_{Max}, 1 \leq n \leq n_{Max}, h_{Min}(r) \leq h \leq h_{Max}(r))$ $q_5$) $\sum_{h=h_{Min}(r)}^{h_{Max}(r)} {}^7b'_h = 1$

Equation 24

$x_{r'} - x_{r''} \geq d_{r',r''}$

FIG. 14

Equation 25 e) $\vec{w}_k \cdot \vec{l}_{i[r',h',n]}(z_0 + k\Delta z) \geq \widetilde{R}_{Max}^{(n)}({}^8b_{h',r'} - 1)$ $(\forall r,n,k | 1 \leq r \leq r_{Max}[n], K_{Min} \leq k \leq K_{Max}, 1 \leq n \leq n_{Max}, h_{Min}(r') \leq h' \leq h_{Max}(r'))$ e'') $\vec{w}_k \cdot \vec{l}_{i[r'',h'',n]}(z_0 + k\Delta z) \geq \widetilde{R}_{Max}^{(n)}({}^8b_{h'',r''} - 1)$ $(\forall r,n,k | 1 \leq r \leq r_{Max}[n], K_{Min} \leq k \leq K_{Max}, 1 \leq n \leq n_{Max}, h_{Min}(r'') \leq h'' \leq h_{Max}(r''))$ $r_{+},h',h''$) $(1 - {}^8b_{h',r'}) \geq {}^8b_{h'',r''}$ $r'_+$) $\sum\limits_{h=h_{Min}(r')}^{h_{Max}(r')} {}^8b_{h',r'} = 1$ $r'''_+$) $\sum\limits_{h=h_{Min}(r'')}^{h_{Max}(r'')} {}^8b_{h'',r''} = 1$

Equation 26

$\sum\limits_{i=1}^{n_\sigma} {}^9b_i \leq 1$

Equation 27

${}^9b_i \leq \sum\limits_{j=1}^{N_{\sigma i}} {}^1b_{\alpha_j,\sigma_i} \quad \forall 1 \leq i \leq n_\sigma$ ${}^9b_i \geq \dfrac{\sum\limits_{j=1}^{N_{\sigma i}} {}^1b_{\alpha_j,\sigma_i}}{N_{\sigma i}} \quad \forall 1 \leq i \leq n_\sigma$

FIG. 15

Equation 29
$$\mathcal{S}_i = \{\alpha_1^{\sigma i}, \ldots \alpha_{N\sigma i}^{\sigma i}\}$$

Equation 30
$$\Gamma_\beta = [\gamma_1^\beta, \ldots \gamma_{J_{Max}}^\beta]^T$$

Equation 31
$$N_\beta^{cluster} = \Gamma_\beta \cdot \Gamma_\beta$$

Equation 32
$$\Gamma_\beta \cdot \vec{s} \geq C^{Cluster} \; {}^{10}b_\beta \; S_{Max}^{Cluster} A$$

Equation 33
$$S_{Max}^{Cluster} \geq \frac{\Gamma_\beta \cdot \vec{s}}{N_\beta^{Cluster}}$$

Equation 34
$$ {}^{10}b_\beta \leq \frac{\Gamma_\beta \cdot \vec{1b}}{N_\beta^{cluster}} \qquad \forall 1 \leq \beta \leq N_{Total}^{Cluster}$$

$$ {}^{10}b_\beta \geq 1 + \Gamma_\beta \cdot \vec{1b} - N_\beta^{cluster} \qquad \forall 1 \leq \beta \leq N_{Total}^{Cluster}$$

$$\sum_{\beta=1}^{N_{Total}^{cluster}} {}^{10}b_\beta \, \Gamma_\beta = \vec{1b}$$

FIG. 16

Equation 35

$$\sum_{\beta=1}^{N_{Total}^{Cluster}} {}^{10}b_\beta (N_\beta^{Cluster})^2$$

Equation 36

$$\vartheta_j S_{Min} - CS_{Max,j} \vartheta \cdot \vec{p} \geq MCS_{Min} E_{Max} ({}^1b_j - 1)$$

$$\vartheta_j S_{Min} - \varepsilon^{Pixel} S_{Max,j} \vartheta \cdot \vec{p} \leq MCS_{Min} E_{Max} {}^1b_j$$

FIG. 17

CONSTRAINED OPTIMIZATION OF LITHOGRAPHIC SOURCE INTENSITIES UNDER CONTINGENT REQUIREMENTS

TECHNICAL FIELD

The exemplary and non-limiting embodiments of this invention relate generally to lithographic formation of integrated circuit patterns and, more specifically, relate to generating optimal lithographic sources under requirements that are contingent on the intensity values in the image or source.

BACKGROUND

This section is intended to provide a background or context to the invention that is recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

The following abbreviations that may be found in the specification and/or the drawing figures are defined as follows:

| | |
|---|---|
| CD | critical dimension |
| DOE | diffractive optical element |
| DOF | depth of focus |
| ED | exposure-defocus |
| IC | integrated circuit |
| LP | linear programming |
| MILP | mixed integer linear programming problem |
| MINLP | mixed integer nonlinear programming problem |
| MIP | mixed integer programming problem |
| MTF | modulation transfer function |
| OPC | optical proximity correction |
| RET | resolution enhancement technique |
| SMO | source mask optimization |
| SRAM | static random access memory |
| UV | ultraviolet |

Introduction

There is increasing interest in methods to optimize the illumination distributions (referred to as sources) used in photolithography. Future generations of lithographic technology will rely heavily on intensively customized sources to increase the quality of the printing process. Intensively customized sources can be physically realized by using, for example, diffractive optical elements (DOEs).

One prerequisite for satisfactorily exploiting such technology is a method for determining a source distribution that provides a specialized benefit to the lithographic application at hand; such methods are referred to as source optimization methods. Rather than choosing the source using assessments that are purely heuristic, the source may be optimized globally, e.g., by finding the optimum source shape without assuming a starting design, and doing so in a way that maximizes a bona fide lithographic metric. The objective function (merit function) may be configured for obtaining the largest possible exposure latitude in focus, e.g., attaining the sharpest possible focused image. See further: A. E. Rosenbluth, S. Bukofsky, C. Fonseca, M. Hibbs, K. Lai, A. Molless, R. N. Singh, and A. K. Wong, "Optimum Mask and Source Patterns to Print a Given Shape," JM3 1, no. 1 (2002): p. 13.

Methods exist for extending the approach of "Optimum Mask and Source Patterns to Print a Given Shape" to optimize for maximum possible process window through focus. So-called ED-window analysis (devised many years ago by B. J. Lin and co-workers) provides a convenient framework for assessing lithographic quality in a way that takes both exposure latitude and depth of focus (DOF) into account. The integrated area of the ED-window is in turn a very useful single-parameter metric for assessing overall image quality. Weakest individual window amongst different features can also be optimized, for example under a constraint that the common window be non-negative. See A. E. Rosenbluth and N. Seong, "Global Optimization of the Illumination Distribution to Maximize Integrated Process Window," SPIE v.6154 Optical Microlithography XIX (2006); [9] A. E. Rosenbluth, "Printing a Mask with Maximum Possible Process Window Through Adjustment of the Source Distribution," U.S. Pat. No. 7,057,709 (2006); and A. K. Wong, R. Ferguson, S. Mansfield, A. Molless, D. Samuels, R. Schuster, and A. Thomas, "Level-specific lithography optimization for 1-Gb DRAM," IEEE Transactions on Semiconductor Manufacturing 13, no. 1 (February 2000): p. 76.

The above methods were formulated to maintain (for each individual mask pattern in the set being optimized) an approximately stabilized 2D image cross-section through focus, or through resist depth. A global source solution may be obtained for optimally printing a "3D" image, e.g., a source can be determined that will maximize the integrated range of dose and focus fluctuations (the latter arising, for example, from small variations in the position of the wafer surface relative to the optimal focal plane of the lens) over which the 3D image could successfully be printed. Here "3D" refers to images which are designed to print openings in the film stack whose cross-sections through depth take on a prescribed non-fixed character. An example of this is a dual damascene structure used commonly for metal interconnects in ultra-large scale integrated circuits. It has recently been recognized that fabrication of such resist openings can be carried out more easily if the resist stack is given a varying sensitivity through depth, for example by stacking multiple resist films with different sensitivities. See D. O. S. Melville, A. E. Rosenbluth, and K. Tian, "Method for Printing with Maximum Possible Process Window a Three-dimensional Design through Adjustment of the Source Distribution with Physical Power Constraints," U.S. Patent Application Publication No. 2009/0021718-A1 (2009).

Limitations of the Conventional Methods for Global Source Optimization

Optimization for maximum process window has been achieved previously through mathematical transformation of percentage dose latitude requirements, to arrive at a reformulation as a near-linear-programming problem—This reformulated problem uses variables representing a scaled version of the unknown source intensities together with additional auxiliary variables, these latter being defined in such a way as to converge to the solution's process window at the optimum. The objective function is then defined as a function that has the same maximum as the process window when the inputs achieve their optimal values. The core computational step in these conventional methods involves the solution of a linear programming (LP) problem, and their success derives in part from mathematical steps that allow converting certain lithographically important source design problems into near-LP form.

However, LP problems involve continuous variables, and it is only in specialized cases that an LP formulation can successfully optimize over a discrete set of possibilities, or over a discrete set of outcomes (e.g., conditional or contingent parameters). As a result, there are many source optimization problems that the conventional LP-based methods cannot easily handle.

For example, custom diffractive optical elements (DOEs) are currently a preferred method for physically realizing the optimized source solutions provided by the conventional methods. Unfortunately, DOEs are somewhat costly, and require appreciable lead times to obtain. These drawbacks are relatively minor in already-established mass-production processes, particularly those used for high volume ICs. However, DOE cost becomes a larger concern in limited-volume applications. In addition, DOE procurement delays can have a multiplicative impact on cost during process development, particularly when cutting edge lithography is used. This is because process development for advanced lithography requires that experimental calibrations be carried out, and the results of these calibrations can prompt adjustments in the source solution, giving rise to a cyclic process of model iteration. The overall impact can be quite costly if DOE procurement delays arise in each such iteration.

Lithographic exposure tools generally offer limited means for making quick adjustments in the illumination source. Specifically, such tools can usually provide sources of circular or annular shape, whose radii can be adjusted freely over a continuous range. In many cases dipole or quadrupole sources can alternatively be selected, with the location and size of the poles being adjustable to some degree. Moreover, multipart-scans can be used to create sources with shapes that combine more than one of these feature types (e.g., so-called windmill sources, which consist of a disk-shaped central lobe combined with 4 flanking lobes from a quadrupole).

To form a multipart-scan source (multiscan or multipart for short), the exposure tool is commanded to expose each wafer more than once, using a series of supported source shapes in order to produce a total source as a combination of supported source shapes. Unlike other multiple-exposure techniques, a multiscan source does not involve use of multiple masks; instead, multiple scans of a single mask are made in order to build up a complex source by superposition. The relative intensity of the different source components in a multiscan source can be adjusted by varying the dose applied during each part of the scan. The wafer does not have to be re-chucked or re-aligned between scans, and the delays arising from use of multiple scans can often be considered acceptable, particularly in the developmental or low-volume applications that precede use of DOEs. (Once the final process is established, the multiscan source can be recreated as a DOE source of identical shape.) Nonetheless, it is often desirable to limit the number of scans in a multiscan to a reasonably small value, such as 2 or 3.

While the multi-scan technique provides access to a large number of potential source shapes, it does not allow the fully general source shape that the prior-art LP methods generally provide. This is because certain properties of the multi-scan sources are only selectable by choosing from among a discrete set of options (e.g., annulus, dipole, quadrupole, etc.). As a result it is not possible to use the simple bitmap source specification. Other source properties that can be adjusted with the multi-scan technique would ordinarily be considered as parametric adjustments, e.g., adjusting the radii of the annular element of a multi-scan source. However, these parametric adjustments can be approximately recast as discrete options by considering a large number of discrete sources whose parametric setpoints are finely stepped, e.g., a set of annuli having all possible combinations of radii from the set (0, 1/10, 2/10, . . . 1).

To expand upon this point, the solutions provided by the conventional LP method usually take a nominally different form, e.g., a non-parametric form, which more specifically is a list of intensity values that are to be applied to each of a number of continuously adjustable directional pixels to form the source. Usually these pixels are chosen to cover the full extent of the addressable pupil space. These pixels can alternatively be given a non-contiguous or overlapped form; however, even if every source option that is accessible via the multi-scan method were used as a pixel, the LP solution would typically involve use of an impractically large number of such sources.

One problem of a contingent aspect of the above procedure is that when defining a source pixel set that consists of different versions of a standard source under a closely spaced sampling of the parametric source adjustments, there is a requirement that a given pixel in the set can only be switched on if sufficiently many of the remaining pixels (source choices) are switched off. What is needed is a reformulation of the parametric optimization problem as an optimization problem with contingent constraints that can be carried out in a broad range of lithography applications.

A related shortcoming in the conventional methods for intensively customizing sources involves experimentally calibrating the lithographic process models used for optical proximity correction (OPC). Specifically, the prior art lacks good methods for addressing the difficulties imposed by delays in carrying out such calibrations due to a lack of immediate access to the source shape that the optimum DOE provides (these DOEs being subject to long procurement lead times). This difficulty is mitigated by the rough separability that current empirically calibrated process models provide. A process model that is calibrated with conventional (or multi-scan) sources will give approximately correct predictions when provided with the optical inputs that would ultimately be obtained from a planned DOE when it becomes available. However, complete separability is difficult to obtain with current empirical process models, and the DOE source may have a noticeably different shape from all immediately available sources.

It would be desirable to obtain conventional or multi-scan sources that create images which match as closely as possible the images that a planned DOE will provide. Conventional methods do not address this need.

Conventional source optimizations are also not especially well-suited to handle certain constraints on minimum pole size. This is particularly true when avoiding small poles in order to prevent strong spatial coherence effects. Increases in spatial coherence extend the range of non-negligible optical interactions between the images of different features, increasing the computation that is required during each iteration of OPC, and slowing down OPC convergence (e.g., increasing the number of iterations required).

Conventional methods can impose a modest limit on spatial coherence by prohibiting any single source pixel from containing a significant fraction of the total source intensity. Such constraints also suffice to prevent illuminator damage from an overly large concentration of light, in most cases. However, the preferred pole-size constraints are sometimes non-local in the sense that they actually allow source pixels to contain somewhat larger intensity when neighboring source pixels also contain intensity; e.g., sometimes stronger limits may be imposed on the intensity of pixels that are isolated. Source pixels that are large enough to substantially overlap can be used, thereby preventing the source solution from containing overly small isolated poles. (In some cases this construction must be supplemented by finely spaced constraints on the total intensity in regions where pixels overlap.) However, small poles are not problematic if their intensity is low, and the finer pupil resolution they provide can be advantageous. For this reason it is not entirely satisfactory to control pole size by using large overlapped pixels.

Conventional methods can also have difficulty handling a size restriction of another kind, namely one that can arise in customizing the polarization of the source. Sources containing pixels that are exactly overlapped may be optimized, and where each overlapped pixel is identical except for being differently polarized, thus allowing polarization to be selected from among a number of possible choices. However, if the solution provided by this prior-art method should happen to contain non-zero intensity in two or more of the fully overlapped pixels of different polarization, it will be necessary for the illuminator to physically realize the solution by providing partially polarized light in the pixel, which would often be too complicated to arrange, and so would likely force the optimizer to be re-run with a fixed polarization choice in the pixel.

Moreover, practical engineering limitations will often only allow polarization to be varied over pupil-domain scale-lengths that are much coarser than the pixel-scale over which intensity can be controlled. For example, in order to handle the intense deep UV fluences required in high-throughput exposure tools, illumination polarization might typically be controlled using damage-resistant polarizing beamsplitters and stressed-SiO2 retarders. It is not easy to deploy and adjust an array of such components at the fine scale of the source pixels, given that the source pixels will generally be laid out at a density appropriate to the desired fine control of source intensity (e.g., typically at least 50 or more pixels in each pupil quadrant). Instead, it would often be more practical to require, for example, that all pixels in each quarter-section of the pupil share a common polarization, so that they can share a common polarizing beamsplitter.

In terms of an optimized source containing overlapped pixels that represent different polarization choices, it would therefore be desirable to add contingent constraints specifying that an overlapped pixel of a given polarization can only be selected if none of its differently-polarized neighbors in the pupil quarter-section are also switched on. The prior art does not address this need.

The conventional optimization method does not fully reduce most source optimization problems to pure linear programs. Typically the final problems it formulates are decompositions in which one or two nonlinear variables are optimized in an outer loop that iteratively calls an LP solver. Though the solution is typically convex in the nonlinear variables, the need to embed the LP solver (a relatively standard piece of software) in a more complex algorithm is a disadvantage to the conventional global methods. The maximum focal extent used in process window integration is an example of such a nonlinear variable. See further: "Global Optimization of the Illumination Distribution to Maximize Integrated Process Window," and U.S. Pat. No. 7,057,709.

In many applications source optimization is intended as one step of a larger litho engineering effort involving mask design (e.g., SMO optimization, or RET selection, or OPC). In such cases the most appropriate goal for the source optimization step may not literally be to select the purely optimal source. For example, the particular source which optimizes integrated common process window amongst many features will typically include a number of (usually weakly lit) pixels which essentially serve the role of biasing the intensities at all feature edges in such a way as to align their individual process windows to a common dose threshold. If the mask design is reasonably suitable, these balancing pixels will have low intensity, and a somewhat equivalent effect that can be obtained by small bias adjustments in the mask features (e.g., by OPC adjustment of the fragmented mask feature edges). However, in some cases the local mask bias adjustment will be able to scale the intensity in the region up or down in a way that does not impact contrast as severely as does the best intensity adjustment that the source can provide.

In general, a better performing solution will typically be obtained if the mask and source variables are adjusted jointly. This may requires a separate module for joint local optimization of mask and source together. Alternatively, such applications may be addressed by alternating steps of source and mask optimization, using simple local process-window OPC for the mask step. This is particularly appropriate if the required mask adjustments are small. Strategies for improving the convergence of such a process may also be used, such as maximizing the worst-feature's process window under constraints requiring non-zero overlap of the different feature windows. Nonetheless, the need to engage separate modules for mask optimization in order to appropriately carry out source optimization is a drawback of the conventional methodology.

Though engagement of full SMO (optimization of both mask and source) provides advantages that source optimization alone cannot, these advantages are not always important. For example, synergistic interactions between mask and source are smaller in cases where the mask features have already been assigned approximate shapes and dimensions (but which are not considered fully frozen in their CDs); such as if the exact mask dimensions are not directly of interest but are being calculated to make the source optimization more meaningful, or in cases where only small OPC-like fine tuning of the feature dimensions is allowed. In such cases it is inconvenient that the conventional source optimization methods may require separate operation of a mask design code.

Strong design forms can be found for the purpose of lithographic optimization by replacing the fixed bands that ordinarily define acceptable edge placement positions with more flexible pairwise constraints of the kind used in design migration. See F.-L. Heng, M. A. Lavin, J.-F. Lee, D. Ostapko, A. E. Rosenbluth, and N. Seong, "Lithographic Process Window Optimization Under Complex Constraints on Edge Placement," U.S. Patent Application Publication No. 2005/0177810A1 (2005) and A. E. Rosenbluth, D. Melville, K. Tian, K. Lai, N. Seong, D. Pfeiffer, and M. Colburn, "Global optimization of masks, including film stack design to restore TM contrast in high NA TCC's," in SPIE v.6520—Optical Microlithography XX, ed. Donis G. Flagello (2007), p. 65200P.

However, the mathematical methods (transformations and specialized variables) that the conventional global methods use to reformulate source optimization as a near linear programming problem rely on the availability of fixed tolerance boundaries along which the image intensity can be sampled to determine the process window. With flexible pairwise constraints the locations of the tolerance boundaries for each feature edge are not fixed; instead they may be contingent on the location of the tolerance boundaries for other edges. As a result the conventional methods for flexible constraints optimization do not yield global source solutions.

During source optimization it would be desirable to have a way of making the various "requirements" that are typically imposed on the printed pattern be conditional on their basic feasibility. There is not always as strong a distinction in real-world engineering between requirements and goals as there is mathematically between constraints and objective in the conventional optimization problem. For example, the conventional methods often enforce the desired polarity of the image by using constraints which specify that the intensity in the interior of dark parts of the image be no brighter than a fraction $R_{Dark}$ of the intensity at the edges of the features, and similarly that the interior intensity of bright image regions be no dimmer than a ratio $R_{Bright}$ of the edge intensity. One might typically choose, for example, values of 0.3 and 1.5 respectively for $R_{Dark}$ and $R_{Bright}$, since such relatively strong image contrast ratios are generally desirable. However, it can sometimes be impossible to achieve a non-zero process window with an image that exhibits such high contrast. Such a failure may happen, for example, during initial steps of an SMO procedure, since SMO can require more than one cycle of optimization over the mask and source before the working solution reaches a generally acceptable quality. In such cases, one might want to adopt more relaxed contrast requirements (such as $R_{Dark}$=0.7, $R_{Bright}$=1.1), under the contingency that no solution can be obtained under more broadly acceptable contrast requirements. In the prior art, this is accomplished by the inconvenient expedient of re-running the optimization.

The conventional method suffers from similar limitations in respect to other constraints—In general terms, it does not provide for contingent selection of the numerical values used to constrain the solution in various respects, unless the user is willing to re-run the optimization when each such contingency is encountered. In such cases the inconvenience of a strategy of repeatedly re-running the optimization can become significant.

Certain conventional methods of SMO are subject to another kind of efficiency limitation when multiple independent regions of a mask are being optimized together. These SMO algorithms include a mask optimization step (which is alternated with source optimization) where the mask design is arrived at implicitly by optimizing the diffraction orders that project through the lens to the wafer, with specific mask features being synthesized during a subsequent "wavefront engineering" step. See further: "Optimum Mask and Source Patterns to Print a Given Shape,", "Global optimization of masks, including film stack design to restore TM contrast in high NA TCC's," and A. E. Rosenbluth and J. T. Azpiroz, "Method for Forming Arbitrary Lithographic Wavefronts Using Standard Mask Technology," U.S. patent application Ser. No. 12/431,865, filed Apr. 29, 2009.

Multiple mask regions can be considered when this kind of SMO is employed. Typically the source optimization step involves finding a single source solution for all parts of the mask, while the different regions of the mask are typically optimized independently (e.g., in their local diffraction orders). When such a mask region is being independently optimized, the exact intensity of the wafer image provided by the diffraction order variables is not generally important, even though the independent mask regions need to eventually be "synchronized" in dose for deployment on a common mask.

The mask optimization problem can be simplified when the absolute intensity level can be neglected, and such is possible when optimizing multiple mask regions because the relative image intensities provided by the different sets of independently optimized diffraction orders need to only be adjusted to match during a later stage of the SMO procedure (namely the wavefront engineering step in which the orders are reduced to specific mask shapes). However, this class of SMO algorithm also includes a source optimization step, in which the source is optimized to print all mask regions simultaneously. This source solution therefore does become dependent on the choice of relative intensity adjustments for the different mask regions, which should be made optimally. Relative intensity adjustment factors may be included as new variables during source optimization. As with the focal range variable described above, the conventional source optimization method optimizes the nonlinear intensity adjustment variables in an outer loop that iteratively calls an LP solver. There is again a disadvantage due to the need to embed the LP solver (a relatively standard piece of software) inside a more complex algorithm.

SUMMARY

The below summary section is intended to be merely exemplary and non-limiting.

The foregoing and other problems are overcome, and other advantages are realized, by the use of the exemplary embodiments of this invention.

In a first aspect thereof the exemplary embodiments of this invention provide a method for illuminating a mask to project a desired image pattern into a photoactive material. The method includes receiving an image pattern. Determining a relationship between source pixels in a set of source pixels to desired intensities at one or more points in the image pattern is performed (for example, by a computer). Linear constraints are imposed on a set of intensity values based on one or more contingent intensity conditions. The contingent intensity conditions include integer variables specifying contingent constraints. The method includes determining values of the set of intensity values in accordance with the linear constraints, using a constrained optimization algorithm. The set of intensity values represents intensities of a set of source pixels. The set of intensity values are output (e.g., by being displayed on a screen, provided to a computer, etc.).

In a further aspect thereof the exemplary embodiments of this invention provide an apparatus for illuminating a mask to project a desired image pattern into a photoactive material. The apparatus includes a receiver configured to receive an image pattern. A controller configured to determine a relationship between source pixels in a set of source pixels to desired intensities at one or more points in the image pattern, to impose linear constraints on a set of intensity values based on at least one contingent intensity condition, where the contingent intensity conditions comprise integer variables specifying contingent constraints, and to determine values of the set of intensity values in accordance with the linear constraints, using a constrained optimization algorithm, is also included. The set of intensity values represents intensities of a set of source pixels. The apparatus also includes an output configured to output the set of intensity values.

In another aspect thereof the exemplary embodiments of this invention provide a computer readable storage medium having computer readable program code embodied therewith, the computer readable program code for illuminating a mask to project a desired image pattern into a photoactive material. The computer readable program code includes instructions, executable by a computer or processor to perform actions. The actions include receiving an image pattern. Determining a relationship between source pixels in a set of source pixels to desired intensities at one or more points in the image pattern is performed (for example, by a computer). Linear constraints are imposed on a set of intensity values based on one or more contingent intensity condition. The contingent intensity conditions include integer variables specifying contingent constraints. The actions include determining values of the set of intensity values in accordance with the linear constraints, using a constrained optimization algorithm. The set of intensity values represents intensities of a set of source pixels. The set of intensity values are output (e.g., by being displayed on a screen, provided to a computer, etc.)

In a further aspect thereof the exemplary embodiments of this invention provide an apparatus for illuminating a mask to project a desired image pattern into a photoactive material. The apparatus includes means for receiving an image pattern. Means for determining a relationship between source pixels in a set of source pixels to desired intensities at one or more points in the image pattern are included. The apparatus also includes means for imposing linear constraints on a set of intensity values based on at least one contingent intensity condition. The contingent intensity conditions comprise integer variables specifying contingent constraints. Means for determining values of the set of intensity values in accordance with the linear constraints, using a constrained optimization algorithm are included in the apparatus. The set of intensity values represents intensities of a set of source pixels. The apparatus also includes means for outputting the set of intensity values

BRIEF DESCRIPTION OF THE DRAWINGS

The foregoing and other aspects of exemplary embodiments of this invention are made more evident in the following Detailed Description, when read in conjunction with the attached Drawing Figures, wherein:

FIGS. 8-17 show equations useful in determining an optimal (or sub-optimal) pixel collection of a bi-scan source.

DETAILED DESCRIPTION

The various exemplary embodiments in accordance with this invention thus provide an improvement over conventional methods of optimizing the source across multiple patterns whose relative image intensity has not yet been fixed.

A lithographic source of illuminating light beams having variable intensity is optimized under source and image constraints that are contingent, for example under a constraint that a source element can only be switched on (have non-zero intensity) if at least one neighboring source element is also on, or alternatively that the element can only be on if the total number of switched-on source elements equals a desired value. Examples are shown of other applications in which the choice of lithographically optimal source depends on contingent constraints involving different intensities that arise in the problem. One or more integer variables are given values specifying the contingent intensity conditions, and the constraints on the source and image are then made contingent using these variables. An objective function is made to obtain an optimal value by adjusting the source variables and the integer variables.

Figure 6:
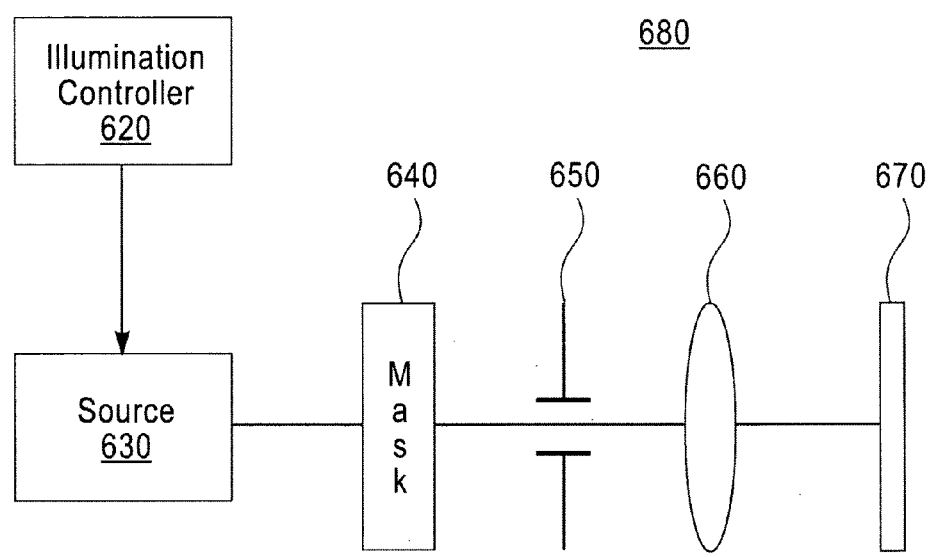
FIG. 6 illustrates a simplified block diagram of an apparatus known in the art for performing photolithography.

Components of a conventional projection lithographic system 680 are shown in FIG. 6. An illumination controller 620 drives an illumination source 630 to illuminate a mask 640 or reticle. The mask includes features that act to diffract the illuminating radiation through a pupil 650 which may control directional extent of the illumination, and through a lens 660 onto an image plane such as a semiconductor wafer 670. The wafer 670 typically includes a resist (photoactive material). When the resist is exposed to the projected image, the developed features in the resist closely conform to the desired patterns that form a target image, which is thus transferred to the wafer 670. The pattern of features on the mask 640 acts as a diffracting structure analogous to a diffraction grating. Increased precision in the formed circuitry depends on the intensities of the illumination that strikes different positions of the wafer 670.

Extension of LP Problems to Include Integrality Constraints

Conventional global methods for source optimization are able to reformulate the core calculation as a near linear programming problem. In this formulation the optimization variables are the intensities of pixels in the illumination pupil. The method is capable of handling certain very specific nonlinearities and conditionalities in the objective function, allowing it, for example, to maximize integrated fractional process window (across defined focal ranges). The conventional methods then include the solution of this linear programming problem as an inner step of their procedure. Reliable LP codes to accomplish this constrained solution have become widely available. They may be used to provide a global solution in polynomial time.

However, LP codes rely on continuous adjustability of the problem variables (within domains defined by linear constraints), and as a result the process window objectives that can be formulated as LPs, though quite useful in lithography, cannot be modified to handle most problems involving conditional choices and constraints.

Classes of mathematical programming problems exist beyond the LP case, for example such problems can include restrictions specifying that certain of the variables are allowed to take on only integer values, resulting in a mixed integer programming problem (MIP). If the constraints and objective in such problems are linear, the problem becomes a mixed integer linear programming problem (MILP).

MILP problems are part of the broader MIP class, which also includes more difficult problems involving direct non-linearities (MINLP). An important difference from the linear programming case is that algorithms to solve MILP problems are only guaranteed to provide the global solution in exponential time. (MINLP problems pose even greater difficulties.) And while MILP problems can often be solved more quickly than this worst-case scaling would suggest, the quality and methodology of available MILP codes has until recently been somewhat uncertain, so that codes yielding broad practical success have not been regarded as routinely available.

However, in recent years the quality of available MILP codes has improved dramatically, for example, see R. Bixby and E. Rothberg, "Progress in computational mixed integer programming—A look back from the other side of the tipping point," Annals of Operations Research 149 (2007): p. 37-41. Moreover, a high quality MILP algorithm has become available as open source code from the COIN-OR project. The examples shown here were generated with the COIN-OR code CBC. Also, while these new codes still require exponentially increasing processing time to provide the global solution with certainty, their speed can be improved in practice by, for example, properly applying known upper bounds on problem parameters, or aiming for converged performance within reasonable margin of full globality.

For these reasons MILP solvers have now come to be regarded as reliable components for attacking problems in business modeling (operations research); however no conventional method is known for applying these codes to lithographic problems. The above-described limitations in the conventional LP-based algorithms for source optimization can be avoided by using exemplary methods in accordance with this invention which formulate various forms of source optimization as MIP problems. Since MINLP solvers are also becoming more reliable (particularly in cases where the continuous nonlinear variables can be optimized locally), it can be appropriate to consider their use, but various embodiments of the invention may use the more robust MILP solvers.

Use of Variables with Discrete Values to Represent Conditional Parameters

In various exemplary embodiments in accordance with this invention, such as those that involve parametric source variables, for example, an adjustable radius of annular source shapes, each such parameter may be converted into a set of separate intensity variables. Specifically, the set of intensity variables is generated by forming a table of pixels each representing a sampled combination of options for the parametric variables, for example, a table of overlapping annular pixels corresponding to a densely sampled collection of possible combinations for the two radii. Each source pixel may be an annulus in the illumination pupil with a particular pair of possible values for its inner and outer radii. The collection of annuli is sufficiently exhaustive to approximately match any allowed pair of inner and outer radii with a member of the collection.

Even though these annular pixels may most naturally be thought of as different sources options, they may instead be regarded as separate pixel elements in an overall source. There is no loss of generality, e.g., any single annular source can be specified in this framework by assigning zero intensity to all other members of the collection. In this way any parametric settings of the annulus may be approximately duplicated using only the (nonparametric) intensity variables representing the pixel intensities.

Such a collection of annular pixels includes a close approximation to all possible annular sources that the lithographic exposure tool can provide. In physical terms, any such annulus represents a complexly-structured beam of light with which the exposure tool can illuminate the mask. Moreover, a multiscan source comprising, for example, a pair of annuli can be obtained by first illuminating the mask with a first light beam corresponding to a first annulus of the annuli, and then with a second light beam corresponding to a second annulus. The intensity of each beam is adjustable, and can account for the mask to have been illuminated by the beams corresponding to every possible annulus in the collection, with all but two of those beams being given zero intensity.

Figure 1:
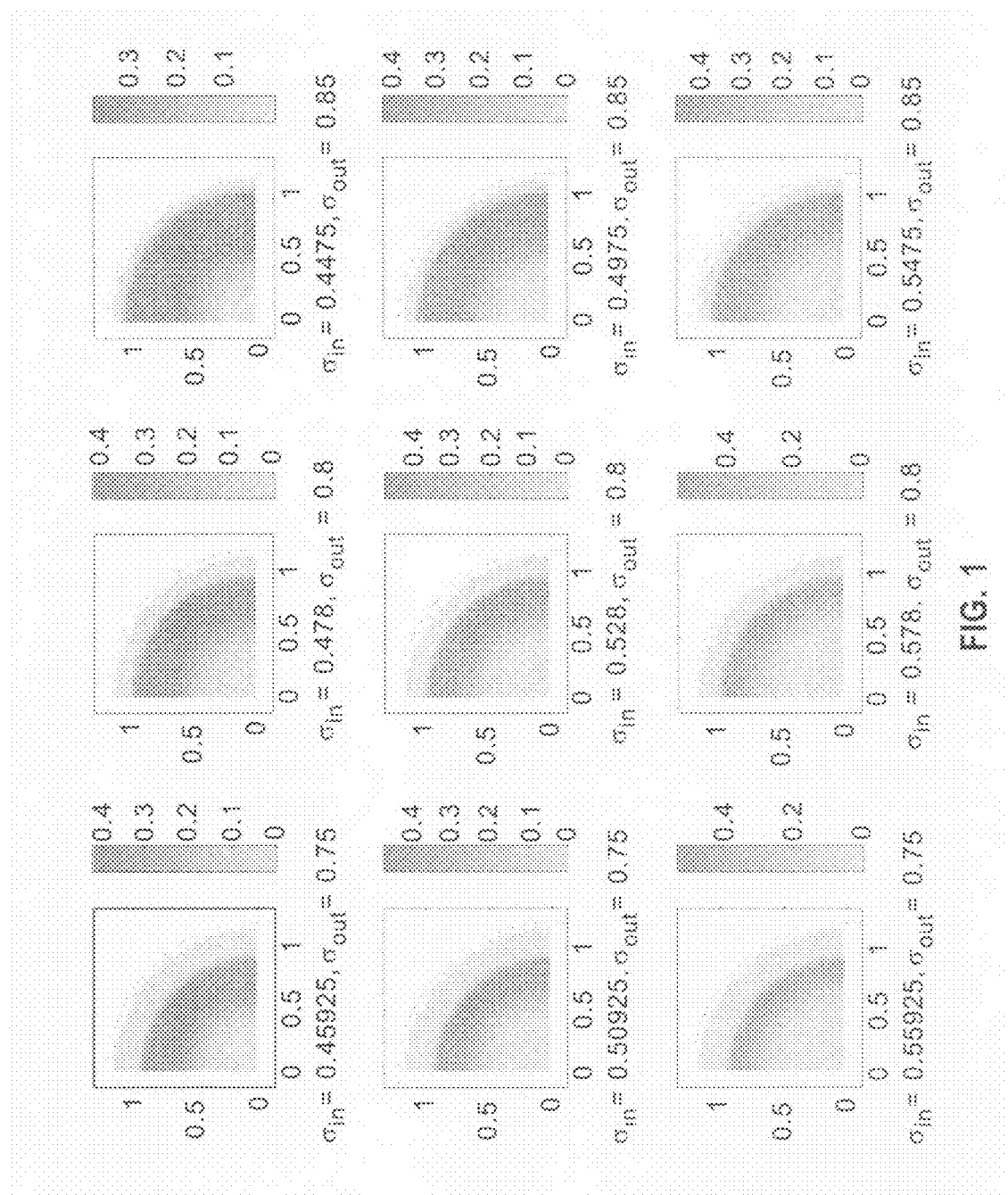
FIG. 1 illustrates examples of a pixel collection that sample the available settings for parameterized source shapes.

Pixel collections that sample the available settings for parameterized source shapes may be referred to as source collections, pixel collections, or source sets. FIG. 1 illustrates a simple example. Lithographic exposure tools can typically provide disk, dipole, and quadrupole sources, as well as annuli. The available parametric options for all of these shape choices may be sampled to add to the source pixel collection a close approximation of all disk, dipole, and quadrupole sources that the tool can provide. To optimize a multiscan lithographic source formed by these standard sources, the optimal intensity value to be assigned to the illuminating beams corresponding to each pixel in the collection may be determined.

Optimization of Multi-Scan Sources; General Source Optimization Framework

If the conventional LP algorithm were used to calculate the optimal intensity values for such a collection of source pixels, the optimal solution would typically contain a fairly large number of non-zero members. However, it is generally desirable that a multiscan source be composed of only a small number of component scans, such as 1, 2, or 3, in order to prevent the multiple-scan exposure process from becoming inordinately slow.

It is possible to limit the total number of components in the scan by applying certain conditional constraints on the source pixel variables; specifically, applying what can be termed as an m-scan constraint to each pixel. The m-scan constraint specifies that the pixel can only be given a non-zero value if the total number of non-zero values in the remaining pixel elements is at most m−1. Thus, an LP formulation supplemented with m-scan constraints (thus able to solve the reformulated problem) can find the optimal (or desired) multi-scan solution consisting of at most m scans. Using conventional notation, the problem could be given the following form as given in Eq. [1] with the new constraints as given in Eq. [2].

Here, following the conventional notation, in the new m-scan constraints shown in Eq. [2] the enclosing || brackets denote cardinality, so that the m-scan constraints represent a requirement on every non-zero pixel that the number of additional non-zero pixels be at most m−1.

Eqs. [1] and [2] are not very tractable in the form given; further reformulations can be used to solve these equations. Specifically, the equivalent of the m-scan constraints can be created by introducing a set of additional variables which are subject to linear and integrality constraints. When these linear and integrality constraints are substituted for the m-scan constraints in Eq. [2], the resulting problem becomes a MILP, which can be solved using standard algorithms.

It will be clear to those skilled in the art that the constraints in Eq. [1] are only representative. Many different kinds of constraints can be used to define the set of possible (e.g., allowed) intensities at the image sample points, and in the source beams. The symbols used in the Eq. [1] example can readily be employed to define many of these variants, as will be clear to those skilled in the art.

Variables $z_0$, $K_{Max}$, and $K_{Min}$ are the centerpoint, upper (positive) limit, and lower (negative) limit respectively of the depth of focus; for simplicity they are expressed as integer multiples of a fixed stepsize $\Delta z$. These focal variables are ordinarily given fixed values in Eq. [1], so that the equation can be solved as a pure LP using standard methods; this LP can then be embedded in an outer search loop which finds optimal values for the focal variables. An alternative approach may optionally be used in the various exemplary embodiments in accordance with this invention.

The optimal (or desired) intensity that should be given to each source pixel in the collection of possible choices is represented as a list of unknowns. Vector notation may be used for this list in which the optimal intensities of the different pixels are tabulated like the components of a vector. Eqs. [1] and [2] follow the conventional practice in choosing units for these source intensities such that the maximum possible value that the illuminator can provide in any pixel is normalized to a level of 1. See further: "Method for Printing with Maximum Possible Process Window a Three-dimensional Design through Adjustment of the Source Distribution with Physical Power Constraints".

The list of unknown pixel intensities is written as $\vec{s}$ but Eq. [1], [2] use a re-scaled list $\vec{\mathcal{S}}$ that is related to the desired solution $\vec{s}$ as given in Eq. [3]

In lithographic applications it may be preferable to define a process window in terms of percentage or fractional variations, rather than absolute variations. By using the scaled $\vec{\mathcal{S}}$ variables it is possible to optimize the integrated fractional exposure latitude, rather than the integrated absolute dose or intensity latitudes. It is convenient to use units for $S_j$ such that the physical limits on their attainable values are scaled to a 0-to-1 range; however the source intensities can have other more specialized limits imposed upon them. The parameters in Eqs. [1] and [3] (e.g., $S_{Max,j}$) may be used to represent problem-specific limits that can be imposed on the intensity of e.g., the jth source pixel. Each $S_{Max,j}$ should always be 1 or less, and will be 1 if the full range of deliverable pixel intensity is to be considered. However, the $S_{Max,j}$ parameters allow stronger restrictions to optionally be placed on some or all of the pixels; for example to enforce a resemblance of the solution to some reference source of interest by limiting the intensities of those solution pixels that are switched-off in the reference source.

In addition, it may be inconvenient to maintain the 0-to-1 pixel intensity scale when the solution is ported to other modules for subsequent lithographic analysis and optimization. For example, the source pixels will typically have different areas, and larger pixels will usually be able to deliver proportionately more light. Eq. [1] uses the symbol $\vec{p}$ to denote the list of maximum possible intensities in un-normalized form that the various pixels can deliver. The term $p_j$ may simply represent the area of the jth pixel, e.g., in units where the full pupil area is 1. Each source pixel is typically given the shape of a symmetric quadrupole, in order to avoid skew through focus. By symmetry, the shape of the pixel-pole in one quadrant of the illumination pupil suffices to determine the pixel shape in the other three quadrants, and by convention pixel properties are often described in terms of single-quadrant parameters only.

The desired properties of the image intensity distribution are specified using discrete sample points whose density sufficiently exceeds the lens resolution such that the sampled intensity adequately represents the character of the image. For example, certain classes of sample points can be used to map out the nominally bright and dark regions of the image; other classes define the boundaries of the acceptable band of positions in which each feature edge can be allowed to print (tolerance bands).

During source optimization, the mask (or masks) that form the image is usually fixed. In the image plane the intensity at a given point can then be written as a sum of contributions from each unknown source element, e.g., as $\vec{s} \cdot \vec{I}$, where $\vec{I}$ is a list of the intensities that each pixel would provide at the given image point if switched fully on. The intensity contributions from different elements add incoherently. Each element of $\vec{I}$ thus expresses as a numerical value the imaging relationship that exists between the intensity of the corresponding source pixel, and the intensity at a particular point in the image (for a given mask). These numerical values can be calculated using image simulation methods.

In many applications, the exposure (reciprocal intensity) at a given image-plane sample point (in this case the ith sample point) can be written as given in Eq. [4], where the x,z position arguments will be explained shortly. The normalization constant of unity in Eq. [4] is commonly used in lithography; however it is applicable when the resist layer has uniform sensitivity (which can then be normalized out).

In certain applications the resist has different sensitivities at different regions, for example at different depths within the resist film. These regions (usually constituting different depth zones within the finite-thickness resist) are designated D. To accommodate the possibility of varying (e.g., controlled) sensitivity across the resist layer, a parameter $t^{(D)}$ is introduced which denotes the time-to-clear for the resist at region D. The term, t, corresponds to the exposure time needed to develop a small local volume of the resist (at some nominal fluence).

The possibility that different target shapes might be desired for the printed feature in different resist regions D is allowed. For example, in advanced damascene technologies the 3D target shape might have different 2D cross-sections that reflect the desire to print different 2D target shapes at different depths in the resist. Since the image shape is defined by sample points, such 3D shape requirements entail the use of separate categories of sample points that are specific to different regions D.

To distinguish bright and dark sample points in different regions a notational convention may be used where the generic subscript index i is written as i(u, D) (for bright) or i(v, D) (for dark), in a given region D. The terms u and v are indices which represent different bright and dark sample points. In a given region D these indices identify an overall sample point index i. Use of distinct letters u and v clearly distinguishes the bright or dark status of sample points in the interior of features. The number of sample points in different D regions may vary, leading to changing integer limits on u and v.

Fractional (or percentage) objectives, like integrated fractional exposure latitude, typically require the specification of a particular "anchor feature" to serve as the normalizing reference. Generally, the printed edge of some critical CD is chosen as the anchor feature. By convention, the D=1 region (e.g., depth position 1) may be designated as the region which contains the anchor feature. For brevity Eq. [1] then makes use of an "effective intensity" that takes into account the varying sensitivity of the resist as given in Eq. [5]

The intensity to incorporate a resist MTF that accounts for effects like resist diffusion can be generalized. This generalized or effective intensity will be referred to simply as the intensity. When applied in the image plane the term "intensity" can be assumed to refer to the effective intensity unless otherwise stated. See further: A. E. Rosenbluth, G. Gallatin, R. L. Gordon, W. Hinsberg, J. Hoffnagle, F. Houle, K. Lai, A. Lvov, M. Sanchez, and N. Seong, "Fast calculation of images for high numerical aperture lithography," SPIE v.5377 Optical Microlithography XVII (2004): p. 615.

Bright and dark sample points enforce the required topology of the image. Specifically, constraints c) and d) in Eq. [1] impose a requirement that the image have an intensity at sample points in the interior of bright and dark features that is distinct from the edge intensity of the anchor feature by factors of at least $R_{Bright}$ and $R_{Dark}$, respectively.

Additional sample points are used to specify the target edge positions and allowed edge placement tolerances for critical CDs in the image. Subscript indices i for such edge sample points are indicated by using the letter r as an argument, e.g., as i[r, D]. This symbol (r) is also a counting index, designating particular edge sample points in a given region. The CD slice for the rth edge point is considered to cut the aerial image along a generic coordinate x. (The same symbol x is used regardless of whether the orientation of the feature edge in question is actually horizontal, vertical, or non-Manhattan.) The CD slice can thus be regarded as a plot of intensity vs. x in a direction through the sample point that is locally perpendicular to the feature edge (which could be curved, e.g., the perimeter of a contact hole), where feature edge refers to the edge of the 2D printed cross-section that is desired within a given region D.

Three sample points are associated with the rth edge point. The first sample point is located precisely at the desired target perimeter for the feature. The intensity at this sample point is denoted $\vec{s} \cdot \vec{I}'_{i[r,D]}(0, z)$ for lens defocus z and region D (e.g., resist depth D). The term x is thus a local coordinate associated with the edge that is defined in such a way that x=0 represents the target edge.

If overexposed, line-like features will contract and space-like features expand. Once a CD tolerance is specified for the feature (or a combined $CD_+$ position shift tolerance), a sample point at the extreme position of allowable overexposure can be placed along the associated CD slice. This sample point position may be denoted as $x=CD_+$. $\vec{s} \cdot \vec{I}'_{i[r,D]}(CD_+, z)$ then denotes the intensity at this position of maximum allowable overexposure within region D (for lens defocus z). Likewise, $x=CD_-$ designates a sample point at the position of worst allowable underexposure, and $\vec{s} \cdot \vec{I}'_{i[r,D]}(CD_-, z)$ is the intensity at this point. Coordinate x refers to an edge-specific coordinate axis along an image cutline, while z refers to the focal position of the entire resist film stack relative to the lens. Different depth positions within the resist may be distinguished using different values of the region index D. Thus, symbol z is not used for the purpose of distinguishing different depth positions.

Figure 2A:
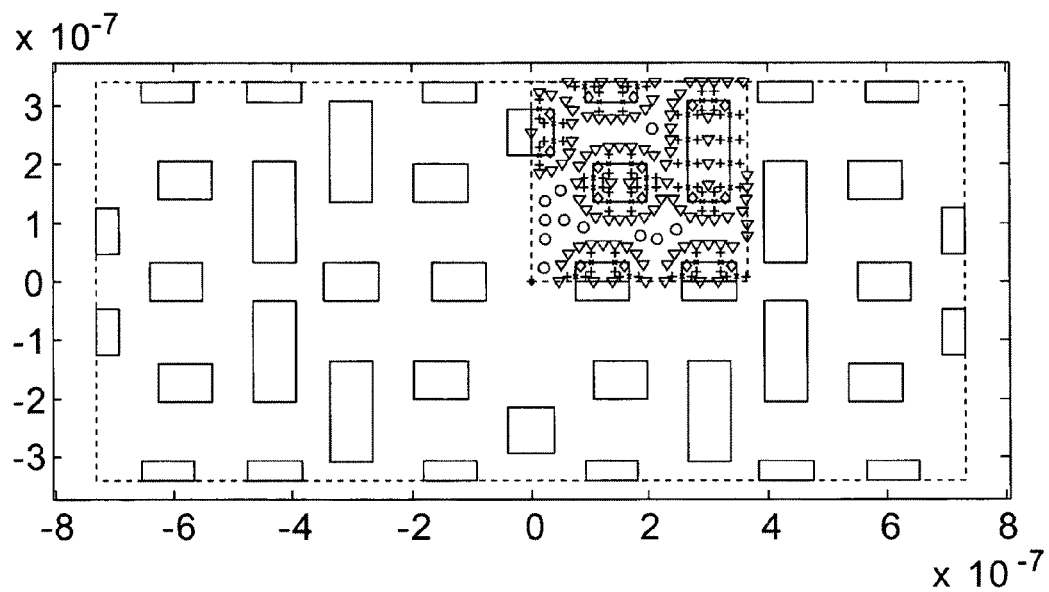
FIG. 2 shows a non-limiting example of sample points laid out for an SRAM contact pattern.
Figure 2B:
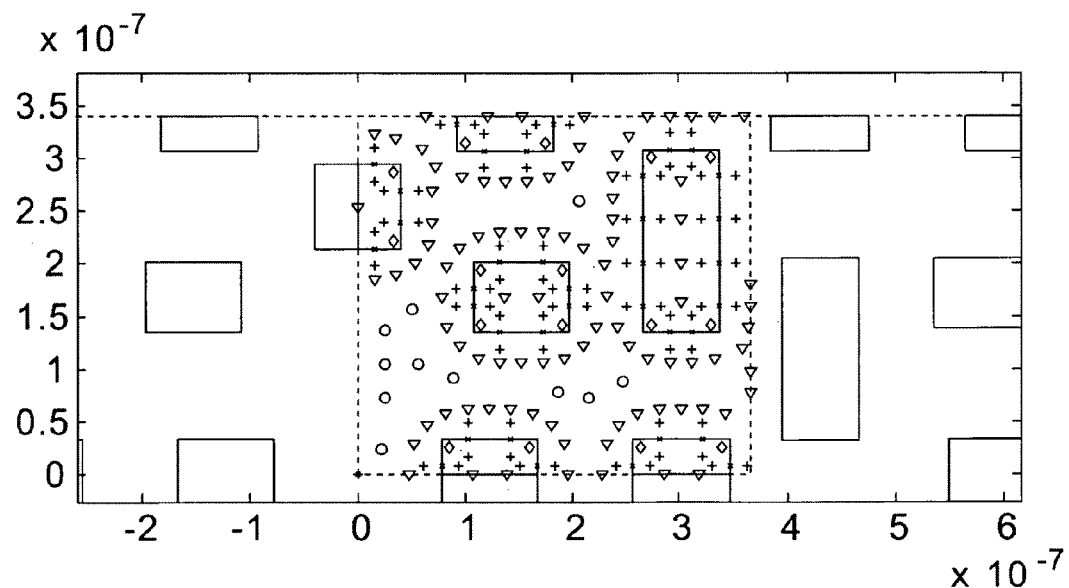

FIG. 2 illustrates a non-limiting example of the sample points described above laid out in order to find an optimal (or desired) source for printing an SRAM contact pattern. The lower image shows a magnified view. The symbols represent the following: 'x'—target edge position; '○'—interior dark sample position; '◇'—corner sample position; 'V'—bright sample position (if inside the rectangular feature) or perimeter dark sample position (if outside the rectangular features, being chosen closest to the perimeter of the rectangular features); and '+'—extreme allowable overexposure (if outside the rectangular features) or underexposure position (if inside the rectangular features).

Constraints a)-k) in Eq. [1] allow an LP solver to maximize integrated fractional exposure latitude across the particular focal range defined by $z_0$, $K_{Max}$, and $K_{Min}$. In brief, the three key considerations that make this reduction successful are 1) the near equivalence between exposure latitude and intensity latitude when both are expressed in fractional or percentage terms (not valid when these quantities are expressed in absolute terms), 2) the desired percentage latitude maximization, which is defined in terms of the physical $\vec{s}$ variables, can be mathematically transformed into a non-fractional problem defined in the $\vec{\mathcal{S}}$ variables, and 3) new constrained variables w and w' can be introduced which ultimately force the objective function to represent integrated process window when maximized. Note that item 1 holds with particularly high accuracy when the percentage latitude is small compared to 100%, as is the case in critical lithographic applications. In such cases the fractional latitude represents a nonlinearity analogous to a logarithmic derivative, but per item 2 this nonlinearity can be removed.

Variables w and w' are constrained to be, respectively, no smaller than the largest relative reciprocal exposure-time required to print the most sensitive of the tolerable over-exposure boundaries (w), and no larger than the smallest relative reciprocal exposure-time required to print the most sensitive of the tolerable under-exposure boundaries (w'). These constraints are applied across all designs, in all wafer regions.

In other words, w and w' are constrained to lie either above (w) or below (w') the limits of allowed exposures (overexposure for w, underexposure for w'), where an allowed exposure is one that prints every feature in every region within tolerance. Separate w and w' variables are applied at each of a number of lens focus (or wafer height) settings that are sampled with reasonable density (e.g., with grid step of $\Delta z$, where $\Delta z$ is small compared to the depth of focus).

The variables for different focal positions are distinguished by a subscript k, where the focal position is $k \Delta z$. The difference w'-w between these variables can then be no larger than the percentage exposure-time latitude for at the kth wafer-height plane. The objective function ψ maximizes the summed w'-w differences, so that the process of maximizing the objective also forces the w'-w objective to press its constraint limits and to become the integrated percentage exposure latitude.

In other words, the Eq. [1] formulation implicitly defines the merit value of a lithographic image to be the integrated process window that it provides, because at its maximum the Eq. [1] objective function will equal the integrated process window.

The term "merit function" is sometimes used to describe a function which actually quantifies the demerits in a potential solution. The optimization problem then becomes one of minimizing solution demerits. Both the maximum and minimum of an objective function are extremum values, and for simplicity the term "extremum" may sometimes be used to refer to either the maximum or minimum, as appropriate for the given formulation.

For the present application an m-scan constraint has been added to Eq. [1] which, together with an appropriately defined collection of pixels as described above, will force the solution to be realizable using a practical number (m) of source scans.

Unfortunately, the m-scan constraint is nonlinear, and as written will prevent Eq. [1] from being solved globally. However, a solvable problem can be reached by replacing the m-scan constraint with the following constraints involving new integer variables $^1b_j$ as given in Eq. [6]. The $^1b_j$ are integer variables that are additionally constrained to be no larger than 1. Since LP and MILP variables are constrained by default to be nonnegative, the integer $b_j$ variables are only able to take on the values 0 and 1; variables in this special class are known as binary variables.

Figure 3:
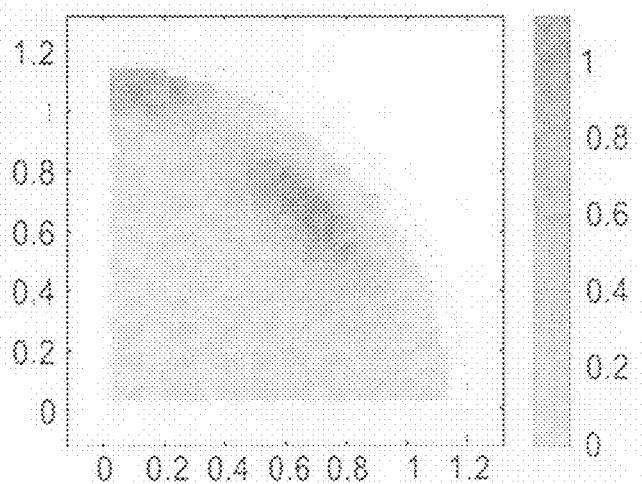
FIG. 3 illustrates an example of a pixel collection of a bi-scan source that has been optimized to print a SRAM contact pattern.
Figure 4A:
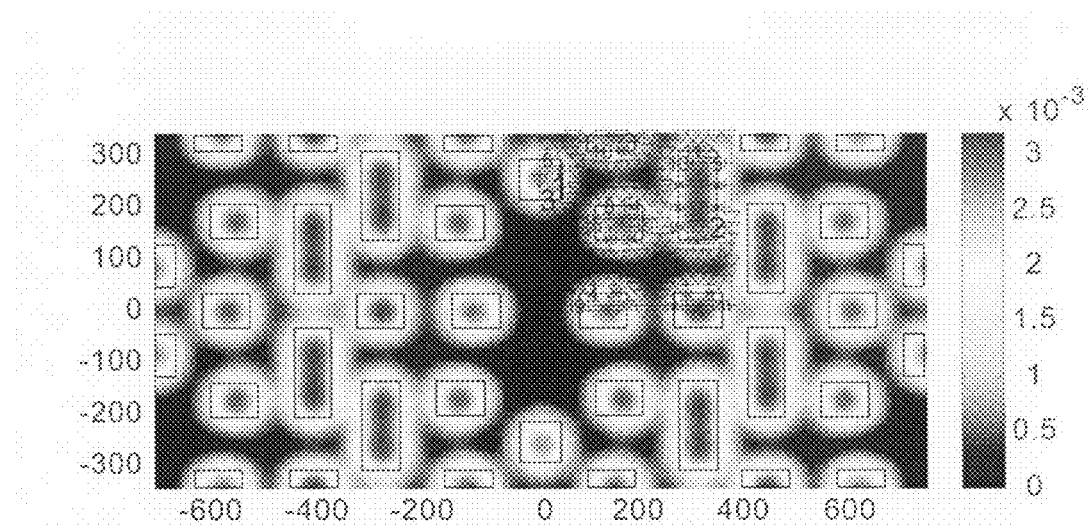
FIG. 4 shows a resulting image created by illuminating a mask using the bi-scan source of FIG. 3.
Figure 4B:
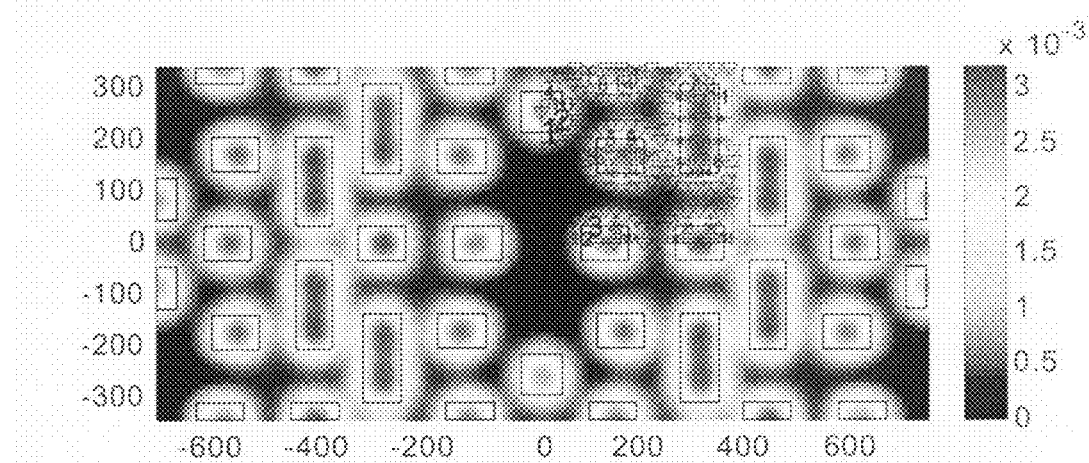

Various exemplary embodiments in accordance with this invention use such variables to make constraints contingent, for example, contingent on whether or not a particular source pixel is used (b=1), or not used (b=0). The presence of these binary variables makes the optimization problem a MILP, and such MILP formulations can address many different limitations of the conventional LP-based optimization method. As an example of the method, FIG. 3 shows a bi-scan source that has been optimized to print the SRAM contact pattern of FIG. 2. FIG. 4 shows a resulting image created by illuminating an optimized mask to print the SRAM contact pattern of FIG. 2 using the bi-scan source of FIG. 3. The upper plot shows the image in focus; the bottom plot the image defocused by 50 nanometers.

A left-superscript 1 may be used to designate the particular binary variables which address the m-scan limitation, e.g., the $^1b$ binary variables are those used in various an exemplary embodiments in accordance with this invention which allows the globally optimum m-scan source to be found (or a sufficient sub-optimum m-scan source). The symbol "b" may be used to denote binary variables that are used in other embodiments, differentiating them from one another with different left-superscript values. Unless stated otherwise, any such variable should be considered binary. Exemplary embodiments of the invention do not require that only a single set of these binary variables be used in any one problem, though problem complexity can grow appreciably when more than one set is used at the same time.

Parameter $E_{Max,j}$ is chosen to be large enough that constraint $m_1$) of Eq. [6] does not exclude the value of $S_j$ that is required by the optimal solution, so long as $^1b_j$ is switched to 1. However, when $^1b_j=0$ this constraint can only be satisfied if $s_j=0$. Thus, by finding an optimal value for the binary variable $^1b_j$, the MILP code can control whether or not the jth source pixel serves as a component of the m-scan source. Constraint $m_2$) of Eq. [6] ensures that the optimal source will require no more than m scans. Constraints like $m_1$) of Eq. [6] may be referred to as "switch" constraints, and quantities like $S_{Max,j}$ $E_{Max,j}$ may be referred to as "switch" parameters. In some cases the switch parameter may contain a simple term, e.g., $S_{Max,j}$ which is either input during problem initialization, or that is determined automatically during the course of optimization. For simplicity, the term "switch parameter" may refer only to the remaining factors (for example, $E_{Max,j}$) whose explicit role is to make the switch constraint function properly.

Constraints like $m_1$) can only be considered to automatically ensure the switched-off configuration if, e.g., the left side variable ($s_j$) is set to an exact integer zero (0), and if the right-side multiplications also result in an integer zero when $^1b_j$ is zero-switched. If necessary one can insulate the solver from numerical misfire in such comparisons by adding an epsilon factor to the right side. Floating point accuracy is easily sufficient for this epsilon to be given a sufficiently small value that any resulting background intensity in switched-off pixels will have negligible lithographic impact.

More generally, providing a "path" to assist the solver in finding the optimal (or sufficient sub-optimal) solution can be adopted. More specifically, after introducing epsilon factors in the problem constraints, these epsilon factors can then be defined as problem variables. These variables can then be added as burdens to the objective function under a signed penalty weight which is sufficiently large to ensure that the optimizer will pursue paths that effectively zero out the epsilons.

Suitable values for switch parameters like $E_{Max,j}$ can be determined in a number of ways. For example, the definitions of the variables involved, and the constraints of the optimization problem, allow one to determine limits implied by the problem physics that the variable values may not exceed. Another approach is to determine bounds on the variables by analyzing a simplified problem, where the simplifications involve relaxing or eliminating some of the true problem's constraints, thereby making the variable bounds obtained in the relaxed problem less restrictive than those of the true problem (as well as being easier to establish).

Although constraint $m_2$) is an inequality constraint, the optimal solution may involve a full set of m scans when m is given typical practical values such as 1, 2 or 3. As most device patterns are sufficiently complex, and most exposure tools sufficiently flexible, the optimal source may involve appreciably more degrees of freedom if practical limitations are not imposed on the number of scans. Nonetheless, it is not unusual to find that a substantial portion of the performance provided by a full m-scan can be achieved by a scan with fewer than m elements. For example, this can occur in cases where the Eq. [1] formulation is modified for so-called "weakest-window optimization". In these cases, the optimal m-scan solution often contains one or more pixels that are quite weak. Since each scan in an m-scan source imposes a throughput penalty, it may be desirable to rerun the optimization with a reduced value of m under such circumstances.

One way to avoid such backtracking is to add to Eq. [6] a constraint set of the form as given in Eq. [7]. Here $E_{Min}$ is set at the expected smallest possible exposure value (see Eq. [4]) that can be expected at the anchor feature. $\epsilon_1$ is a threshold setting that is used to rule out scans of such low intensity that their impact does not justify additional scans. Eq. [7] ensures that the optimizer will revert to the optimal m−1 scan when some scan elements of the optimal m-scan contribute too little of a dose to be worthwhile. Though the choice of $\epsilon_1$ is somewhat arbitrary and non-critical, inaccuracies in estimating $E_{Min}$ may alter the stringency with which the optimizer judges the importance of using the full set of m scans.

The solution quality is nominally vulnerable to excessive underestimation of the switch-parameter parameter $E_{Max,j}$ (see Eq. [6]). However, MILP codes can cause an exponentially increasing growth in execution time as the problem size is increased. Execution time can also be impacted by large gaps in behavior between the MILP problem and the associated LP problems that result from removing the integrality constraints on the integer variables (including binary variables). If $E_{Max,j}$ were given a value that was substantially larger than the value attained by Eq. [4], the associated LP problems would need to work through large numbers of $\vec{S}_j$ and $^1b_j$ combinations that are infeasible in the full MILP.

A useful general approach for obtaining suitable values for $E_{Max,j}$ is to use a version or subset of the Eq. [1] constraints that is simplified to more easily establish an upper limit on the values of the elements of $\vec{S}$. For example, constraints like b) in Eq. [1] (the so-called OPC constraints) imply that each element of $\vec{S}$ is bounded as given in Eq. [8] where $r_{Max,OPC}$ must be at least 1, in order to cover the anchor feature.

Eq. [8] provides a way to set $E_{Max,j}$; namely as the right-hand side of the equation. However, when only a few edge sample points are subject to an OPC constraint the Eq. [8] bound may not be particularly tight for certain pixels j. In that case, the bound may be tightened by considering other sample points. For example, when a solution has reasonably high quality it is possible to expect that at every $CD_+$ overexpose tolerance sample point along the edge, $\vec{S} \cdot \vec{T}'_{i[r,n]}(CD_+, z_0)$ is less than 1 since the Eq. [4] exposure would usually be large at such a point. However, though the points in question are overexpose sample points this does not guarantee with certainty that their intensity will always be lower than the anchor intensity. Adding a factor L provides a cushion against false infeasibility when deriving bounds from such points, e.g., as given in Eq. [9] where L would be set to 1 for edge sample points that are subject to OPC constraint b), and may be set (very conservatively) to 3 at other edge sample points, and to 2 and 4 respectively at $CD_+$ and $CD_-$ sample points.

The right sides of Eqs. [8] and [9] represent useful choices for the switch parameter $E_{Max,j}$. Such parameters can also be set by considering reasonable limits that are entailed by the physics of the problem. Such settings should be made somewhat conservatively so that the assigned values are not so small as to preclude optimal solutions, whereas cautious overestimates may usually not slow solver performance severely as long as the values are physically realistic to order of magnitude. For example, in the case of the $^1b_j$ variables it is possible to obtain a reasonable universal value for $E_{Max}$ (acceptable for all j) by considering its relationship to the Eq. [4] exposure.

From Eq. [3], Eq. [4], and constraint b) of Eq. [1], it is possible to arrive at Eq. [10] and see that a useful bound is obtained by taking the reciprocal of the smallest possible print threshold $(\vec{s}\cdot\vec{I}')$ that can be expected at the anchor feature. Print thresholds are familiar quantities in lithographic engineering, and are often explicitly investigated when process models are developed. A typical value for $(\vec{s}\cdot\vec{I}')$ in advanced applications is about 0.15, with more accurate estimates generally being possible in each individual case.

Tighter bounds can also be established by explicitly solving simplified versions of the primary problem. For example, a useful value for $E_{Max}$ (or $E_{Min}$) may be obtained by solving a simplified LP in which $(\vec{s}\cdot\vec{I}')$ is minimized (or maximized) under some subset of the full conditions, such as constraints a)-d). The full Eq. [1] problem still has to satisfy these constraints, but it also has to satisfy many others. Moreover it also uses a different objective, hence it must yield a larger $(\vec{s}\cdot\vec{I}')$ (in the case of minimization) and therefore a smaller $1/\vec{s}\cdot\vec{I}'$ (or a larger $1/\vec{s}\cdot\vec{I}'$ in the case of maximization). The bound from the simplified LP must therefore be valid in the full problem. Variations on this approach are to maximize the sum of the elements of $\vec{S}$ or to run separate simplified LPs to maximize each individual $S_j$ in order to establish independent bounds for each.

Duplicating Calibration Images from Long-Lead-Time DOEs by Using Multi-Scan Sources The constraints of Eqs. [6] and [7] allow a MILP solver to provide the optimal m-scan source for printing a required set of lithographic shapes (or to provide a sufficient sub-optimal m-scan source). The resulting m-scan solution may not provide as good performance as an intensively customized DOE, and for m>1 it may not provide as high throughput. However, it avoids the high cost of a DOE, and the delays involved in procuring an intensively optimized DOE. As discussed above, one problematic aspect of long DOE lead times is the delay imposed in developing empirically calibrated process models, e.g., the delay entailed by the lack of immediate access to the true illumination conditions under which the process will be carried out. In cases where an intensively customized DOE is chosen over an m-scan source, it may be desirable to mitigate the impact of the associated procurement delays.

This problem can be addressed using m-scan sources. One difference from the more basic use of m-scan sources for direct lithography is that the calibration problem does not require calculation of a single globally optimum source to print a set of patterns with maximum process window, as Eq. [1] does. For the calibration problem, the calibration images that the future DOE source will eventually provide need only be reproduced (approximately), and there is no need to reproduce all calibration images using only a single m-scan source. (Model calibration generally requires exposure of only a few measurement wafers, so exposure time is not a major concern.) And while model calibration usually contains an empirical component, current process models succeed in achieving a degree of robustness in their predictive abilities, so exact reproduction of the true-DOE-source images is not required. Many different m-scan sources can be used to reproduce these images, and any particular one of these sources need only reproduce some particular subset of the images.

To find the m-scan source most suitable for approximately reproducing some subset of the true-DOE-source calibration images (referred to as the hth subset), the following MILP as given in Eq. [11] can be solved for the hth m-scan source $\vec{s}_h$. Here the $r_{Max}[h]$ different sample points are chosen to thoroughly characterize critical features in calibration images of subset h. The term $\vec{s}_{DOE}\cdot\vec{I}'_{r,DOE}$ denotes the fixed intensity provided by the true-DOE-source at the rth sample point.

A MILP can also be formulated as choosing which particular calibration images are to be formed with each of the various m-scan sources. This can in turn be folded into the problem of designing these sources by replacing the 1) constraints in Eq. [11] with those given in Eq. [12]. In Eq. [12], E represents a parameter that is chosen to be slightly larger than the maximum possible error that can be expected in reproducing the calibration images. The $^2b_{r,h}$ binary variables make the 1) constraints contingent on whether the image containing sample point r is to be printed with the hth m-scan source (if $^2b_{r,h}=0$), or not (if $^2b_{r,h}=1$). As the optimizer adjusts the shapes of the sources to maximally match the images, it also optimizes the assignment of the images to the different sources by optimizing the values of the $^2b_{r,h}$ variables.

Constraints on Minimum Pole Size; Polarization Optimization Under Engineering Constraints Contingent integer variables can also be used to address the above-described drawbacks to conventional methods of enforcing minimum pole size. For example, if a source is pixelated on a regular grid, then a minimum pole size requirement to control spatial coherence might take the form of a contingent constraint to the effect that whenever a source pixel is switched on, at least one of its neighboring pixels in the adjacent rows or columns must also be switched on. Regular-gridded sources follow a framework in which each source pixel represents a light beam that illuminates the mask, in many cases with zero intensity. As another example, a pole size requirement aimed at thermal uniformity might take the form of a conditional constraint on certain pixels at large radii in the pupil which only allows them to be on (at significant intensity) if at least one neighbor in the tangential direction is also on, in order to prevent an overly large astigmatic flux load in the pupil.

A general method for optimizing the source under such contingent constraints on pole size can be reached. Letting q(j,i) denote the pixel index of the ith neighbor of pixel j, where $1 \le i \le q_{Max}$, the pole size requirements can be imposed by adding the constraints as given in Eq. [13] to Eq. [1]. The term $p_{Tol}$ is a tolerance setting which represents the intensity level at which a switched-on pixel is considered to contain significant flux. If the flux from the jth pixel exceeds this level (as scaled by an $E_{Max}$ or $E_{Max,j}$ switch parameter), constraint $n_2$) causes binary variable $^3b_j$ to take on the value 1. Under this contingency, constraint $n_1$) then causes the neighbors of the jth pixel to be given at least as large a cumulative intensity as pixel j. The same method can be used to apply conditional linkages between any sets of pixel variables.

Such a method can be useful for optimizing source polarization in a way that can practically be engineered in an exposure tool. Specifically, integer variables may be used to constrain source pixels in a specified zone of the pupil (such as in one quadrant of the pupil) to share a common polarization, while allowing the polarization choice for each of the different quadrants to be made optimally. This addresses the practical difficulty of providing each intensity pixel of the source with an independent polarization in the typical case where the source contains tens or hundreds of intensity pixels.

To tackle the problem of polarization optimization, each ordinary intensity pixel is "cloned" into multiple duplicate pixels each representing a different polarization option. Standard choices may be used for the polarization options, such as X polarized, Y polarized, tangentially polarized, azimuthally polarized, 45° polarized, or 135° polarized. The $\tilde{I}'$ coefficients produced by each source pixel at any image-plane sample point may be calculated by standard vector imaging methods, taking the source pixel polarization into account.

In addition to the usual j index that distinguishes different intensity pixels, a second subscript "o" is used to index the polarization options available for a particular source intensity pixel, so that the illumination from pixel j using polarization option o involves assigning non-zero intensity to variable $s_{j,o}$. The total number of polarization options can be denoted as $o_{Max}$, where the notation has been simplified slightly by neglecting to list a possible dependence of $o_{Max}$ on j. As in Eqs. [1] and [3], homogeneous variables $\mathcal{S}_{j,o}$ (denoted with a cursive font) may be introduced in order to eliminate the ratio nonlinearity arising in the definition of process window.

Another drawback of the conventional method for polarization optimization is that it potentially forces solutions of complex mixed polarization state when the LP is initially solved. This limitation may be overcome by using binary variables to force selection of a single polarization option in each pixel. These are constraints $o_1$) and $o_2$) in Eq. [14]. The illuminator design is considered to divide the source into zones (such as quadrants) with all intensity pixels in a given zone being required to use a common polarization choice. An index R is used to distinguish the different zones (with $R_{Max}$ denoting the total number of zones). Binary variables $^4b_{j,o}$ are introduced to specify the contingent condition, e.g., that pixel j adopts polarization choice o. Constraints $o_3$) are then used to enforce a common zone polarization as given in Eq. [14].

Contingent Relaxation of Problem Constraints if Objective Proves Infeasible

Another advantage of various exemplary embodiments in accordance with this invention is that they allow the specifications of a target image to be traded off against performance levels that can be realistically achieved. This is a flexibility that is frequently desirable in practice. This flexibility may be achieved by making the relevant constraints contingent on the feasibility of acceptable performance. An example of such constraints are the image-shape constraints on minimum required contrast between bright and dark regions (for example, constraints c) and d) in Eq. [1]). It may be desirable to make these constraints contingent on solution feasibility.

Prior optimization methods express desirable contrast levels by constraining the image intensity in the interiors of bright and dark regions to maintain values that respectively exceed, or remain below, preset ratios $R_{Bright}$ and $R_{Dark}$, where these ratios are taken against the anchor intensity, and are typically given well separated values, e.g., $R_{Bright}=1.5$ and $R_{Dark}=0.3$. It may be preferred, however, to accommodate contingencies in which no such high contrast solution is possible, and this could be done by accepting less aggressive contrast ratios, e.g., when no finite process window can be achieved from an image satisfying the original $R_{Bright}$, $R_{Dark}$ ratios. In the conventional method this can only be accomplished by re-running the optimization. However, various exemplary embodiments in accordance with this invention can handle such contingencies in a single optimization.

For example, this can be done by first replacing the Eq. [1] objective with the equation as given in Eq. [15] where $E_{PW}$ is chosen to be somewhat larger than any process window that could possibly be achieved in the problem of interest. Thus, the optimizer gives higher priority to zeroing out binary variable $^5b$ than it will to any feasible adjustment of the source variables. Constraints c) and d) in Eq. [1] may be replaced as given in Eq. [16]. The $\tilde{R}$ contrast parameters are given appropriately relaxed values (e.g., $R_{Bright}=1.1$, $R_{Dark}=0.8$) for the case in which no finite process window is achievable with images of more standard contrast. Since constraint k) in Eq. [1] ensures that the process window is positive, the optimizer will only apply the $\tilde{R}$ constraints in the properly contingent way.

The same method can also be used to make a contingent selection of the number of scans that will be used in the multi-scan source. For example, a relatively small number of scans can be used so long as an adequate process window is achieved, but otherwise the method can accept a larger number.

The method can also be generalized to allow the numerical value chosen for some particular constraint or constraints to be chosen on the basis of more than one contingency.

Optimization of DOF Variables

Various exemplary embodiments in accordance with this invention address a drawback to the conventional focus optimization. Constraint k) in Eq. [1] enforces a non-negative process window throughout the depth-of focus (which is $[K_{Max}-K_{min}]\Delta z$). Prior global source optimization methods use an outer loop to search for optimal values for the nonlinear variables $z_0$, $K_{Max}$, and $K_{Min}$ which determine the planes of extreme focus and best focus. (More precisely, $K_{Max}$ and $K_{Min}$ are the focus offsets from the plane of best focus, in steps of $\Delta z$.)

Coding the outer loop search optimization by applying a conditional form of the focus-dependent constraints on the source variables can be avoided. The conventional focus-dependent constraints (like constraint e) in Eq. [1], which applies at the focal plane $z=Z_0+k\Delta z$) may be replaced with constraints that are contingent on the associated focal plane's presence in the range specified by the depth of focus variables that are being optimized, or are at the plane specified by a best focus variable that is being optimized.

For convenience, two optional integer variables $K_+$ and $K_-$ may be employed to define the positive and negative extents of the depth of focus (on a $\Delta z$ grid relative to the optimal focus, this latter also being optimized with contingent integer variables). Two parameters $K'_{Max}$ and $K'_{Min}$ are also defined which represent the most extreme positive and negative boundaries that the focal range may exhibit. $K'_{Max}$ and $K'_{Min}$ differ from $K_{Max}$ and $K_{Min}$ in that the latter represent the focal extent achieved by the solution while the former are chosen to lie at larger focus extremes than could possibly be realized by the solution. Another difference is that the $K'_{max}$ and $K'_{min}$ parameters are defined as specific positions in space (on a $\Delta z$ grid relative to the fixed lens focus $z=0$), rather than as offsets from the optimal lithographic focus $z_0$ (which varies from problem to problem, in general).

Next, a binary variable, $^6b_k^{(0)}$, is associated with each focal plane (e.g., the kth) which specifies whether the kth focal plane is the plane of best focus. Constraints b), c), and d) of Eq. [1] are made contingent on whether their associated focal plane is in fact the plane of best focus as given in Eq. [17]. On the right side of constraints b), c) and d) $\check{R}_{max}^{(n)}$ has been used as an upper limit for the intensity imbalance. Since this limit is obtained outside the depth of focus it is reasonable to give $\check{R}_{max}^{(n)}$ a slightly larger value than the $R_{Bright}^{(n)}$ parameter which is obtained at the plane of optimal focus. (Contrast away from the optimal focal plane usually will be reduced, but the situation may be reversed.)

Next, the k Δz focal planes are associated with a second set of binary variables $^6b-k^{(0,0)}$ which can only be 0 on the negative side of the plane of best focus, and can only be 1 on the positive side as given in Eq. [18]. (The $^6b_k^{(0,0)}$ variable is not needed for the k=$K_{Min}$ focal plane; it is assumed to lie on the negative side.)

Additional binary variables $^6b_k^{(+)}$ and $^6b_k^{(-)}$ are defined for the k Δz focal planes. These binary variables have values that are contingent on whether or not the plane is within the depth of focus on either the positive $^6b_k^{(+)}$ or negative $^6b_k^{(-)}$ side of best focus as given in Eq. [19], where, $K_+$ and $K_-$ are optional integer variables which provide as output the size of the focal range on each side of the plane of best focus.

The focus-dependent constraints e)-k) are contingent on the focal plane's presence in the positive or negative focal range as given in Eq. [20]. (For simplicity the contingent-version of the remaining e)-k) and p) constraints have been omitted, whose construction should be straightforward to those skilled in the art.)

Simultaneous Local Optimization of the Mask and Global Optimization of the Source; Flexible Constraints Optimization Another application for integer variables representing contingent conditions arises in the joint operation of source optimization and OPC. A simple alternation of source optimization and mask OPC is not always efficient. Full SMO offers powerful methods for jointly optimizing mask and source. These methods involve operations that may be overly complex and computer-intensive even for the simplest case, for example, one in which approximate shapes for the mask have already been chosen, but where final adjustments must still be made, including fine-tuning of the shape dimensions in conjunction with source optimization.

One approach to such problems is to use a MINLP solver. Full global optimization with such a solver may be computationally quite difficult, but the achieved performance may exceed that attained with a sequential decomposition into source and local mask optimization steps.

Taking advantage of the small size of the intended mask adjustments by making an approximation that the intensity changes at a given wafer location will be influenced by only one or two nearby feature adjustments on the mask it is possible to treat such problems with a MILP solver. In making such an approximation the complexity of the adjustments that are contemplated (as well as their magnitude) may be limited, for example, the mask features may not be given their full OPC-grade fragmentation; the adjustments may only involve certain mask-feature fragments that are found to be critical; the adjustments of several fragments along a given edge may temporarily be locked together, so that the edge may only be adjusted inward or outward as a unit; etc. A very simple mask adjustment of this kind is one that employs a uniform positive or negative bias applied to all features.

Contingent variables can be used to jointly optimize the source and mask as a MILP problem, with the qualification that while the source is optimized globally, the mask is only adjusted in a small, perturbative way. The optimization may be freely rerun through multiple cycles of such small steps, in order to accumulate a substantial adjustment. Although potentially slower than a simple alternation of source optimization with mask optimization, this approach has the advantage of handling joint interactions between source and mask variables.

Under small localized adjustments to the mask, a limited subspace of possible mask adjustments that significantly affect the intensity at a sample point can be identified for each image sample point (for example, variation of only one or two of the many different adjustments that can be made among all the mask features in the problem). For each of these adjustments, it is possible to identify a limited range within which the adjustment is consistent with the requirement of an image impact that is small and largely localized. This limited adjustment domain is sampled at a reasonably fine level, arriving at a set of possible image vectors $\vec{I}'_{r,h}$, where the index h identifies the particular adjustment condition that is adopted amongst those that influence sample point r. In the case where adjustments in one particular mask feature are capable of significantly influencing the intensity at sample point r (in the regime of small adjustments), each such condition would involve adopting a particular setpoint for that mask feature, independent of the setpoints used for other mask features.

Alternatively, if there are two mask features that are capable of significantly influencing the intensity at sample point r (even when the adjustments are constrained to be small), each such adjustment condition would involve a pair of setpoints, e.g., one setpoint for each of the mask adjustments. In such cases each index value h would designate a pair of mask variable setpoints. Binary variables are used which have values are made contingent on whether a particular adjustment condition is adopted; these are denoted $^7b_h$'. A given adjustment condition may influence more than one sample point (e.g., may be used with more than one value of r). In such a case the same subspace of possible mask adjustments for each of the r values involved may be referenced.

An individual adjustment of a single independent mask feature may represent one component of a number of different adjustment conditions. Subscript 'e' is used to designate an adjustment of a single mask feature, and variables $^7b_e$ are made contingent on whether an adjustment of an independent mask feature is adopted. Constraints are adopted which indicate when a particular adjustment condition is contingent on a particular adjustment of some one of the mask features. In the simplest case where an adjustment condition involves only a single variable, these may take the form as given in Eq. [21]. Alternatively, the particular adjustment condition h may involve a pair of setpoints for two independent mask adjustments, for example those specified by adjustments $e_1$ and $e_2$. This kind of contingency is specified by the constraints as given in Eq. [22].

Using these definitions of desired adjustment conditions, constraints b)-h) in Eq. [1] are made contingent on the appropriate choice of adjustment condition, for example as given in Eq. [23]. Constraint e) in Eq. [23] is obtained under the contingency that adjustment condition h is selected. Constraint $q_5$) specifies that an adjustment is chosen for the mask feature or features which govern the particular image location. Similar modifications may be made in constraints b)-d) and f)-h). (The method can also handle adjustments to the lithography process that involve inputs other than mask features.)

Such contingencies can also be used to implement more flexible constraints than tolerance band constraints. For example, pairwise constraints of the kind used in compactor codes may provide flexibility during lithographic optimization. Optimization with such constraints is known as "flexible constraints optimization", but flexible constraints are not compatible with the conventional method for global source optimization because the latter relies on constraints like e) and g) in Eq. [1] to cause the w and w' variables to define the process window (when the objective function $\psi$ achieves its maximum). Constraints e) and g) are defined by the image intensity at fixed sample points, for example, sample points along the fixed $CD_+$ and $CD_-$ boundaries of the band of allowable positions for each edge.

A method in accordance with an exemplary embodiment of this invention allow the application of such tolerance constraints at a given edge to be made contingent on the edge tolerance constraints that are applied at another edge, and in turn, allow for implementation of the pairwise constraints of the flexible constraints method. For example, a situation where intensity cutlines (e.g., image cross-sectional slices) are across two adjacent parallel edges in the image, and the two cross-sections are located at the same position along each edge, where the two cutlines become coincident. When flexible constraints are employed the $CD_{+,0,-}$ sample points are not given fixed positions along the cutlines, but the cutline position can still be fixed along the perpendicular coordinate (e.g., along the edge). The index number of the sample point along one edge is then denoted as r', and r" denotes the sample point along the other edge. Each of these r indices represents three sample points, those at the $CD_+$, $CD_0$, and $CD_-$ tolerance positions. These positions are not fixed along the cutline.

Instead, the tolerable positions for the printed edges are defined by flexible pairwise constraints, e.g., as given in Eq. [24] where $d_{r',r''}$ specifies a minimum acceptable separation between the r' and r" edges. Mask optimization in the flexible constraints method is local, and is carried out during inner loops in which the allowed edge adjustments are confined to a small "trust region". See further: "Lithographic Process Window Optimization Under Complex Constraints on Edge Placement" and "Global optimization of masks, including film stack design to restore TM contrast in high NA TCC's".

Though the exact position of e.g., the $CD_+$ sample point is not fixed during flexible constraints optimization, the range of possible positions is then limited by the trust region. Little flexibility is sacrificed if these possible positions are further limited to a discrete set of finely sampled choices within the trust region that are defined by an index h. The terms $r_+'$ and $r_+''$ are defined to be the $CD_+$ sample point locations for the two edges. The particular index h choices for the $r_+'$ and $r_+''$ sample points are denoted by h' and h" respectively, and binary variables $^8b_{h'}$ and $^8b_{h''}$ are defined to specify the contingency which these particular nominal edge positions are chosen (variables $^8b'_{h'}$ and $^8b'_{h''}$ are likewise defined for the $CD_-$ positions). Constraints r) are introduced. Constraint r) (more specifically, $r_{+,h',h''}$) prevents positions h' and h" from being chosen if they violate Eq. [24]. See Eq. [25]. The other process window constraints in Eq. [1] can be changed to flexible constraints using the same procedure.

The conventional methods provide a simple form of mask adjustment, one that arises in conventional SMO algorithms, namely an adjustment that involves using wavefront engineering methods to adjust the intensity of an image up or down without changing its shape, e.g., to scale the amplitudes of all diffraction orders uniformly without changing their relative magnitude. Because process window is defined in terms of fractional or percentage exposure latitude, such an adjustment provides no benefit when the source is optimized to print a single mask region, and in such a case it would be appropriate to simply maximize overall intensity during the wavefront engineering step. However, when the source is being optimized to simultaneously print more than one mask region, one may wish to allow an independent adjustment of the intensity in one or more of the regions, compared to the intensity at the anchor feature. This is particularly true during intermediate stages of an SMO procedure, when a final definition of the masks has not been made. In such cases one can use Eq. [23] in a non-perturbational way, and Eqs. [21] and [22] may not be needed.

Contingent conditions can also be used to ensure that the poles of a multi-pole source are constrained to have similar inner and outer sigma values, while the intensity of the poles may be set independently. This can be useful in addressing a concern that arises in tool matching. This concern refers to the problem of adjusting the open aperture of the illumination pupil, which usually has the form of a ring, to compensate out the optical signature differences that arise from the small variations in the overall optical system that are present in different lithographic exposure tools. Usually this involves the adjustment of the value of the inner and outer sigma of the open aperture, which is an effective knob in this tuning process. In a single-scan scenario using a conventional source, this problem can be handled using cycles of adjusting the rings and measuring the sigma to achieve the desired inner sigma value and the desired outer sigma value.

When moving to multi-scan, this setting may be different for each particular DOE (scan) and, as a result, it may not be possible to achieve an acceptable set of inner and outer sigma for all scans. Likewise, in a single-scan scenario using an optimized custom DOE, it is not necessarily the case that a sufficient number of poles will have inner or outer radii that are aligned with the aperture inner and outer radii. This may cause the tuning process of the optical signature to be less effective.

The poles in an optimized multi-pole exposure source may be set such that they have a common sigma. This can be achieved by proper modification of the source optimization problem, for example in the multi-scan case. Additionally, a multi-scan scenario with many standard DOEs can be realized using a single-scan of a custom DOE.

To achieve the desired similarity between the sigma values of the poles, an additional constraint may be considered during the MILP optimization. In particular, this constraint ensures that all pixels that are selected have the same inner sigma value and the same outer sigma value, as shown in Eq. [26] and Eq. [27]. Here, $^9b_i \in \{0,1\}$ is the new binary variable with index i in $\{1, \ldots n_o\}$, where $n_o$ is the number of possible combination of inner and outer sigma values for all DOEs.

The constraint of Eq. [26] ensures that only one binary value is set to a single combination of an inner sigma and an outer sigma. A set of indices called $\vec{S_i}$ is associated with each binary variable $^9b_i$. This set represents the indices of the source pixels that have the desired inner sigma value and the desired outer sigma value. For example, $\vec{S_i}$ holds the indices of source pixels $\vec{s}$ that have the same inner and outer sigma specified by $\sigma_i^{in}$ and $\sigma_i^{out}$, for i in $\{1, \ldots n_o\}$ (and consequently, the indices of the corresponding binary variables $^1\vec{b}$ for the source pixels). Accordingly, Eq. [28] can be written to express this relationship, where $N_{\sigma_i}$ is the number of source pixels with inner and outer sigma specified by $\sigma_i^{in}$ and $\sigma_i^{out}$.

Contingent constraints can also be used to ensure that the optimum source is chosen when it is required that any pixel which is actually used in a source must achieve some minimum intensity weight, so that any pixel which provides a non-zero intensity contribution to the source must in fact provide a relative intensity contribution that exceeds a minimum requirement. This can be useful when it is difficult to actually manufacture source pixels with low but non-zero intensity.

More generally, possible illumination sources may include pixelated sources, where the intensity of each pixel of the source map may be controlled. As such, the optimization process may be tuned to find an optimum value for the intensity of each of the source pixels (e.g., $s_j \forall 1 \leq j \leq J_{Max}$). It is possible to allow any combination of source pixel intensities in the final solution (as this maximizes the solution space); however, limitations on the relative values of source pixel intensities may also be imposed. These limitations may be due to any number of factors, for example, fabrication tolerances, beam divergence issues, etc.

A minimum non-zero intensity limitation constraint, in a simple form, states that source pixels may have either zero intensity or a normalized intensity between C and 1, where lower limit C is a constant, such as 0.1, in the range of (0,1]. This constraint prevents active source pixels from having arbitrarily small intensities, for example because excessively dim pixels may not be producible by a given source fabrication technology, with lower limit C defining the minimum acceptable non-zero pixel intensity.

This constraint may take the form of Eq. [36], which involves binary integer variables $^1b_j$. As shown, M is a modest multiplier such as 2, and $\epsilon^{Pixel}$ is a quantity such as $10^{-5}$ which is small enough to be considered equivalent to zero for lithographic purposes, yet large enough numerically to ensure that Eq. (36) can be satisfied by setting the jth pixel intensity to zero whenever $^1b_j$ is zero.

In a more complex form, a constraint on minimum non-zero intensity may be applied to a cluster of pixels which are active and situated close to each other. The overall intensity produced by the pixels of a cluster may be either zero or between C and 1 in a normalized intensity scale. The normalization may be made using the maximum pixel intensity in the source map as a reference. Such constraints may be added to the MILP source optimization problem using integer variables.

The term $N_{Total}^{Cluster}$ represents the total number of possible clusters that can be formed in a source map. Each cluster may consist of one or more pixels, for example, a single pixel or an arbitrary combination of single pixels. The number of pixels in a cluster may be limited to a maximum number. The maximum number may be chosen in view of any number of factors, for example, the size of the pixels when normalized with respect to the Gaussian diffusion sigma in the source intensity map. A set of binary variables, $^{10}b$, are defined such that, $^{10}b_\beta \in \{0,1\}$, where $1 \le \beta \le N_{Total}^{Cluster}$, with each value of the index $\square$ identifying one of the possible clusters. A binary variable $^{10}b_\beta$ is equal to one when all pixels inside the corresponding cluster are active (having non-zero intensity), and likewise the binary variable is set to zero when at least one of the pixels inside the corresponding cluster is inactive (has a zero intensity).

A vector $\Gamma_\beta$ is associated with each cluster and labels the source pixels that belong to each cluster. In particular, $\Gamma_\beta$ is defined in Eq. [30], where $\gamma_j^\beta \in \{0,1\}$ is a binary constant given by the particular topology of the cluster $\beta$, where $1 \le \beta \le N_{Total}^{Cluster}$ and where $1 \le j \le J_{Max}$. $J_{Max}$ is the total number of source pixels. For example, $\gamma_j^\beta = 1$ indicates that the source pixel with index j belongs to the cluster with index $\beta$ and $\gamma_j^\beta = 0$ indicates that the source pixel with index j does not belong to the cluster with index $\beta$. A source pixel may belong to more than one cluster depending on the topology of the clusters. The total number of source pixels that are active in a given cluster can be calculated as another constant as shown in Eq. [31], where the symbol "•" represents inner product.

Eq. [32] defines a constraint on the minimum intensity of clusters. Adding the constraint of Eq. [32] to the original MILP problem enforces on each cluster a constraint that the minimum nonzero intensity is larger than $C^{Cluster}$. In Eq. [32], $1 \le \beta \le N_{Total}^{Cluster}$ and A represents a reference source area in terms of the pixel area (e.g., A can be set to 1 when the reference source area is equal to the pixel area). The term $C^{Cluster}$ represents a constraint constant which depends on the source type and tolerances (a typical value for $C^{Cluster}$ may be 0.1) and the term $S_{Max}^{Cluster}$ represents a maximum normalized cluster intensity as given by Eq. [33], where $1 \le \beta \le N_{Total}^{Cluster}$. The new binary variables $^{10}b_\beta$ are associated with active clusters at each step of source optimization. The constraints given in Eq. [34] may be used to set the value of the $^{10}b_\beta$ binary variables.

Furthermore, in order to prioritize clusters with larger areas over clusters with smaller areas, the linear function shown in Eq. [35] may be added to the objective of the source optimization.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

It should thus be appreciated that at least some aspects of the exemplary embodiments of the inventions may be practiced in various components such as integrated circuit chips and modules, and that the exemplary embodiments of this invention may be realized in an apparatus that is embodied as an integrated circuit. The integrated circuit, or circuits, may comprise circuitry (as well as possibly firmware) for embodying at least one data processor or controller that is configurable so as to operate in accordance with the exemplary embodiments of this invention.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Based on the foregoing it should be apparent that the exemplary embodiments of this invention provide a method, apparatus and computer program(s) for illuminating a mask to project a desired image pattern into a photoactive material.

Figure 5:
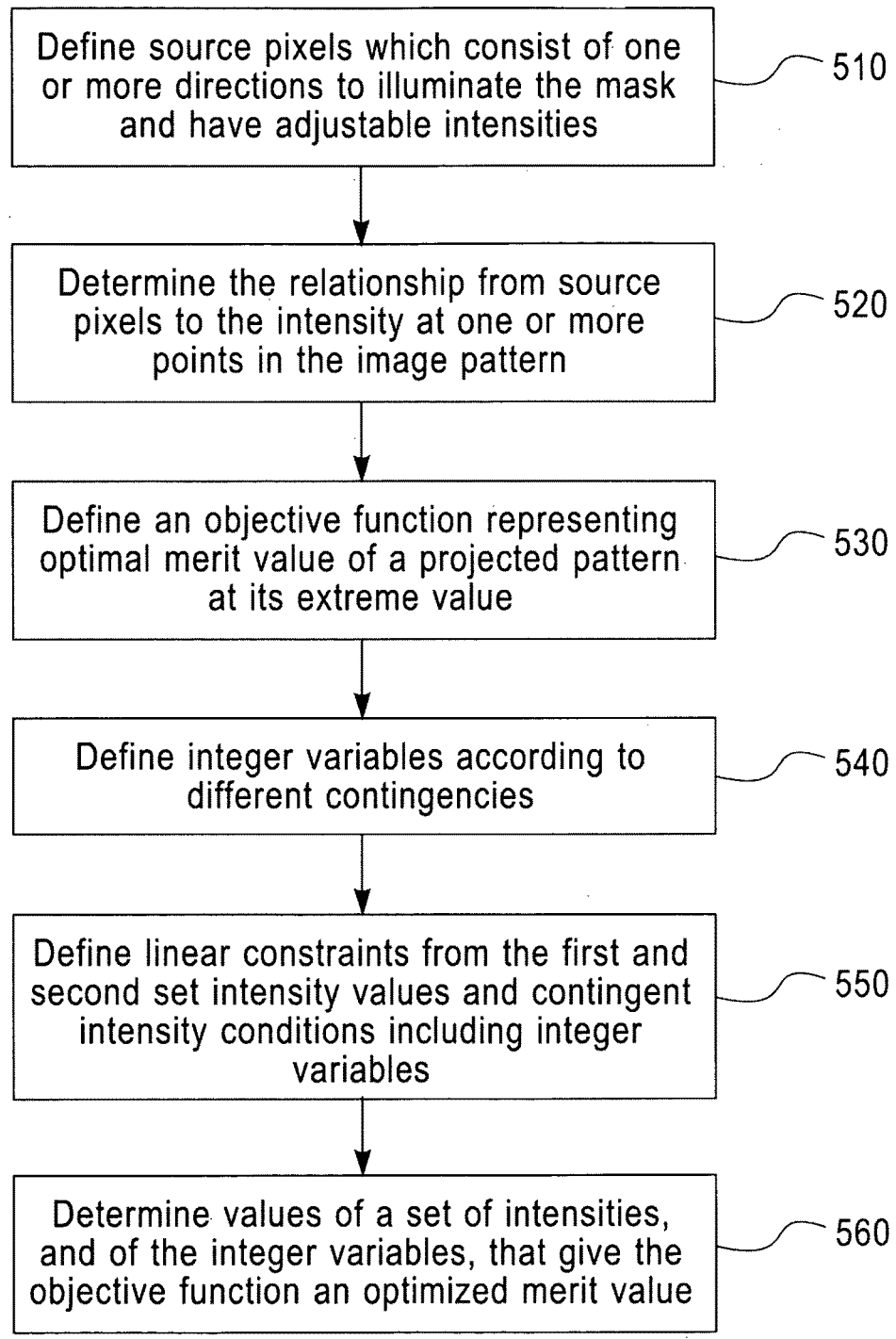
FIG. 5 is a logic flow diagram that illustrates the operation of an exemplary method, and a result of execution of computer program instructions embodied on a computer readable memory, in accordance with the exemplary embodiments of this invention.

FIG. 5 is a logic flow diagram that illustrates the operation of a method, and a result of execution of computer program instructions, in accordance with the exemplary embodiments of this invention. In accordance with these exemplary embodiments a method performs, at Block 510, a step of defining source pixels which consist of one or more directions to illuminate the mask and have adjustable intensities. The relationship from source pixels to the intensity at one or more points in the image pattern is determined, at Block 520. At Block 530, an objective function representing optimal merit value of a projected pattern at its extremum value is defined. Integer variables are defined according to different contingencies, at Block 540. At Block 550, linear constraints are defined from contingent intensity conditions including integer variables. Values of a set of intensities, and of the integer variables, that give the objective function an optimized merit value are determined, at Block 560.

Figure 7:
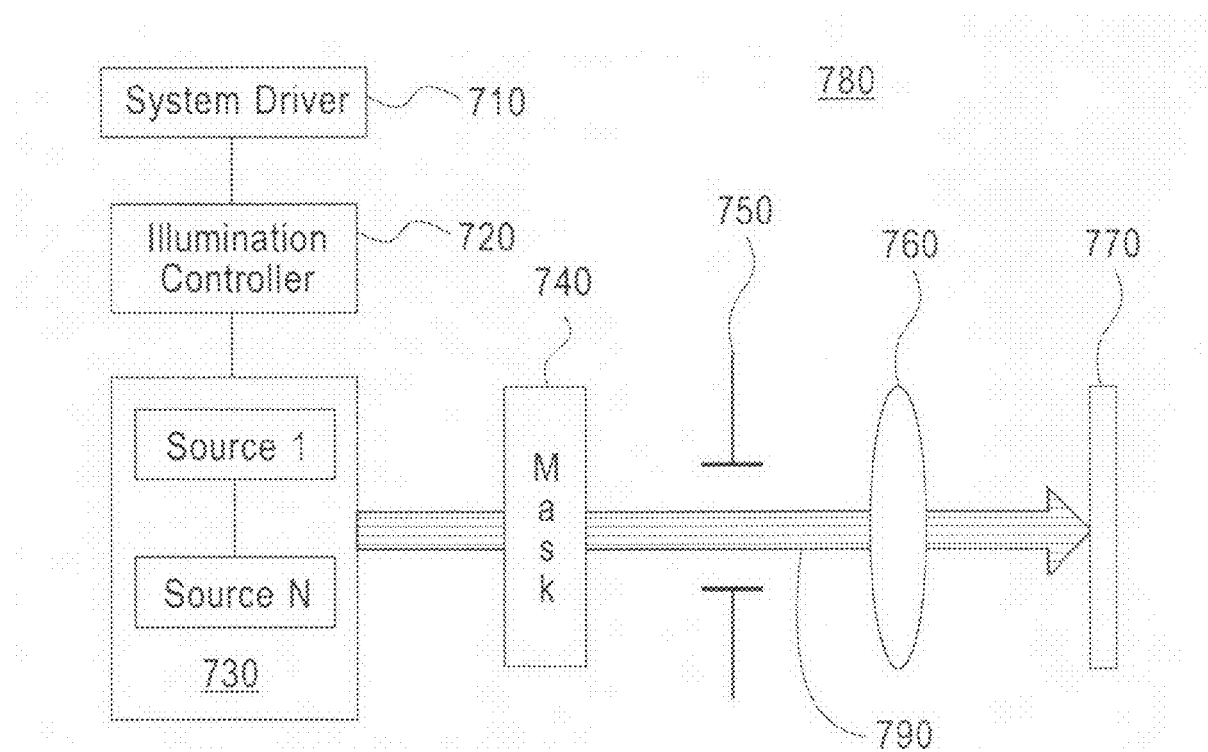
FIG. 7 illustrates a simplified block diagram of a system that is suitable for use in practicing the exemplary embodiments of this invention.

FIG. 7 depicts one embodiment of a system 780 that includes a system driver 710 for operating in accordance with exemplary embodiments of this invention. Preferably, the system driver 710 communicates with, and may control, the illumination controller 720 which drives a number of illumination sources 730. The sources 730 provide a number of incident beams of light 790 which may be from different directions and have different intensities. Preferably, the system driver 710 provides for execution of instructions for obtaining the source solution. The system driver 710 may include any equipment as appropriate for execution of the instructions. Non-limiting examples of system driver 710 components include at least one data processor or controller, software (a computer program), a computer readable medium or memory (such as a magnetic and/or optical disk drive, tape, semiconductor storage, and other types of memory). Other system driver 710 components may be included. The system 780 may make use of other components present in prior art lithography systems 680, such as those shown in FIG. 6.

An exemplary embodiment in accordance with this invention is a method for illuminating a mask to project a desired image pattern into a photoactive material. The method includes receiving an image pattern. Determining a relationship between source pixels in a set of source pixels to desired intensities at one or more points in the image pattern is performed (for example, by a computer). Linear constraints are imposed on a set of intensity values based on one or more contingent intensity condition. The contingent intensity conditions include integer variables specifying contingent constraints. The method includes determining values of the set of intensity values in accordance with the linear constraints, using a contingent optimization algorithm. The set of intensity values represents intensities of a set of source pixels. The set of intensity values are output (e.g., by being displayed on a screen, provided to a computer, etc.)

In a further embodiment of the method above, the desired intensities at the one or more points in the image pattern are represented by a merit value of an image pattern at its extremum value.

In an additional embodiment of any one of the methods above, the method also includes receiving the output at an illumination source; and illuminating a lithographic mask (for example, via the illumination source) with light according to the set of intensity values.

In a further embodiment of any one of the methods above, using a global optimization algorithm includes using a mixed integer linear programming problem algorithm.

In an additional embodiment of any one of the methods above, the one or more contingent intensity condition includes one or more of: a condition that a source element may be switched on only if one or more neighboring source element is also on; a condition that a source element may be switched on only if a resulting total number of switched-on source elements equals a desired value; a condition that all source elements in a defined zone have a given polarization; and a condition that a source element may be switched on only if an resulting focal plane is a desired plane of focus.

In a further embodiment of any one of the methods above, the method also includes determining mask parameters for a mask to be illuminated by the set of source pixels. The mask parameters and the values of the set of intensity values may be determined simultaneously.

In an additional embodiment of any one of the methods above, the values of the set of intensity values provide a synchronized n-pole source. The one or more contingent intensity condition may also include a condition that the poles in the n-pole source have similar inner sigma values and similar outer sigma values.

In a further embodiment of any one of the methods above, a cluster includes one or more source pixels and the one or more contingent intensity condition includes a condition that solutions using large illuminated clusters are prioritized over solutions using multiple smaller, illuminated clusters.

An additional exemplary embodiment in accordance with this invention is an apparatus for illuminating a mask to project a desired image pattern into a photoactive material. The apparatus includes a receiver configured to receive an image pattern. A controller configured to determine a relationship between source pixels in a set of source pixels to desired intensities at one or more points in the image pattern, to impose linear constraints on a set of intensity values based on at least one contingent intensity condition, where the contingent intensity conditions comprise integer variables specifying contingent constraints, and to determine values of the set of intensity values in accordance with the linear constraints, using a contingent optimization algorithm, is also included. The set of intensity values represents intensities of a set of source pixels. The apparatus also includes an output configured to output the set of intensity values.

In a further embodiment of the apparatus above, the desired intensities at the one or more points in the image pattern are represented by a merit value of an image pattern at its extremum value.

In an additional embodiment of any one of the apparatus above, the apparatus also includes an illumination source configured to receive the output at an illumination source; and to illuminate a lithographic mask with light according to the set of intensity values.

In a further embodiment of any one of the apparatus above, using a global optimization algorithm includes using a mixed integer linear programming problem algorithm.

In an additional embodiment of any one of the apparatus above, the one or more contingent intensity condition includes one or more of: a condition that a source element may be switched on only if one or more neighboring source element is also on; a condition that a source element may be switched on only if a resulting total number of switched-on source elements equals a desired value; a condition that all source elements in a defined zone have a given polarization; and a condition that a source element may be switched on only if an resulting focal plane is a desired plane of focus.

In a further embodiment of any one of the apparatus above, the controller is also configured to determine mask parameters for a mask to be illuminated by the set of source pixels. The mask parameters and the values of the set of intensity values may be determined simultaneously.

In an additional embodiment of any one of the apparatus above, the values of the set of intensity values provide a synchronized n-pole source. The one or more contingent intensity condition may also include a condition that the poles in the n-pole source have similar inner sigma values and similar outer sigma values.

In a further embodiment of any one of the apparatus above, a cluster includes one or more source pixels and the one or more contingent intensity condition includes a condition that solutions using large illuminated clusters are prioritized over solutions using multiple smaller, illuminated clusters.

An additional exemplary embodiment in accordance with this invention is a computer readable storage medium having computer readable program code embodied therewith, the computer readable program code for illuminating a mask to project a desired image pattern into a photoactive material. The computer readable program code includes instructions, executable by a computer or processor to perform actions. The actions include receiving an image pattern. Determining a relationship between source pixels in a set of source pixels to desired intensities at one or more points in the image pattern is performed (for example, by a computer). Linear constraints are imposed on a set of intensity values based on one or more contingent intensity condition. The contingent intensity conditions include integer variables specifying contingent constraints. The actions include determining values of the set of intensity values in accordance with the linear constraints, using a contingent optimization algorithm. The set of intensity values represents intensities of a set of source pixels. The set of intensity values are output (e.g., by being displayed on a screen, provided to a computer, etc.)

In a further embodiment of the computer readable storage medium above, the desired intensities at the one or more points in the image pattern are represented by a merit value of an image pattern at its extremum value.

In an additional embodiment of any one of the computer readable storage media above, the actions also include receiving the output at an illumination source; and illuminating a lithographic mask (for example, via the illumination source) with light according to the set of intensity values.

In a further embodiment of any one of computer readable storage media above, using a global optimization algorithm includes using a mixed integer linear programming problem algorithm.

In an additional embodiment of any one of computer readable storage media above, the one or more contingent intensity condition includes one or more of: a condition that a source element may be switched on only if one or more neighboring source element is also on; a condition that a source element may be switched on only if a resulting total number of switched-on source elements equals a desired value; a condition that all source elements in a defined zone have a given polarization; and a condition that a source element may be switched on only if an resulting focal plane is a desired plane of focus.

In a further embodiment of any one of computer readable storage media above, the actions also include determining mask parameters for a mask to be illuminated by the set of source pixels. The mask parameters and the values of the set of intensity values may be determined simultaneously.

In an additional embodiment of any one of computer readable storage media above, the values of the set of intensity values provide a synchronized n-pole source. The one or more contingent intensity condition may also include a condition that the poles in the n-pole source have similar inner sigma values and similar outer sigma values.

In a further embodiment of any one of computer readable storage media above, a cluster includes one or more source pixels and the one or more contingent intensity condition includes a condition that solutions using large illuminated clusters are prioritized over solutions using multiple smaller, illuminated clusters.

An additional exemplary embodiment in accordance with this invention is an apparatus for illuminating a mask to project a desired image pattern into a photoactive material. The apparatus includes means for receiving an image pattern. Means for determining a relationship between source pixels in a set of source pixels to desired intensities at one or more points in the image pattern are included. The apparatus also includes means for imposing linear constraints on a set of intensity values based on at least one contingent intensity condition. The contingent intensity conditions comprise integer variables specifying contingent constraints. Means for determining values of the set of intensity values in accordance with the linear constraints, using a contingent optimization algorithm are included in the apparatus. The set of intensity values represents intensities of a set of source pixels. The apparatus also includes means for outputting the set of intensity values In a further embodiment of the apparatus above, the desired intensities at the one or more points in the image pattern are represented by a merit value of an image pattern at its extremum value.

In an additional embodiment of any one of the apparatus above, the apparatus also includes means for receiving the output and for illuminating a lithographic mask with light according to the set of intensity values.

In a further embodiment of any one of the apparatus above, using a global optimization algorithm includes using a mixed integer linear programming problem algorithm.

In an additional embodiment of any one of the apparatus above, the one or more contingent intensity condition includes one or more of: a condition that a source element may be switched on only if one or more neighboring source element is also on; a condition that a source element may be switched on only if a resulting total number of switched-on source elements equals a desired value; a condition that all source elements in a defined zone have a given polarization; and a condition that a source element may be switched on only if an resulting focal plane is a desired plane of focus.

In a further embodiment of any one of the apparatus above, the apparatus also includes means for determining mask parameters for a mask to be illuminated by the set of source pixels. The mask parameters and the values of the set of intensity values may be determined simultaneously.

In an additional embodiment of any one of the apparatus above, the values of the set of intensity values provide a synchronized n-pole source. The one or more contingent intensity condition may also include a condition that the poles in the n-pole source have similar inner sigma values and similar outer sigma values.

In a further embodiment of any one of the apparatus above, a cluster includes one or more source pixels and the one or more contingent intensity condition includes a condition that solutions using large illuminated clusters are prioritized over solutions using multiple smaller, illuminated clusters.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Various modifications and adaptations to the foregoing exemplary embodiments of this invention may become apparent to those skilled in the relevant arts in view of the foregoing description, when read in conjunction with the accompanying drawings. However, any and all modifications will still fall within the scope of the non-limiting and exemplary embodiments of this invention.

Further, the various terms used to describe optimal solutions (e.g., optimal, optimum) are not intended to be strictly limiting in any respect, as these various term may also include sub-optimal solutions.

Furthermore, some of the features of the various non-limiting and exemplary embodiments of this invention may be used to advantage without the corresponding use of other features. As such, the foregoing description should be considered as merely illustrative of the principles, teachings and exemplary embodiments of this invention, and not in limitation thereof.

What is claimed is:

1. A method for illuminating a mask to project a desired image pattern into a photoactive material, the method comprising:
   receiving an image pattern;
   determining a relationship between at least one source pixel in a set of source pixels to at least one desired intensity at at least one point in the image pattern;
   imposing at least one linear constraint on a set of intensity values based on at least one contingent intensity condition, where the at least one contingent intensity condition comprises at least one integer variable specifying at least one contingent constraint;
   determining values of the set of intensity values in accordance with the at least one linear constraint, using a constrained optimization algorithm; and
   outputting the set of intensity values, where the set of intensity values represents intensities for the set of source pixels;
   where the at least one desired intensity at the at least one point in the image pattern is represented by a merit value of an image pattern at an extremum value determined by using a mixed integer linear programming algorithm configured to optimize the set of source pixels by constraining source pixels in defined zones to share common polarization orientations.

2. The method of claim 1, further comprising:
   receiving the output at an illumination source; and
   illuminating a lithographic mask, via the illumination source, with light according to the set of intensity values.

3. The method of claim 1, where the at least one contingent intensity condition comprises at least one of:
   a condition that a source element may be switched on only if at least one neighboring source element is also on;
   a condition that a source element may be switched on only if a resulting total number of switched-on source elements equals a desired value;
   a condition that all source elements in a defined zone have a given polarization; and
   a condition that a source element may be switched on only if a resulting focal plane is a desired plane of focus.

4. The method of claim 1, further comprising:
   determining mask parameters for a mask to be illuminated by the set of source pixels, where the mask parameters and the values of the set of intensity values are determined simultaneously.

5. The method of claim 1, where the values of the set of intensity values provide a synchronized n-pole source and where the at least one contingent intensity condition comprises a condition that the poles in the n-pole source have similar inner sigma values and similar outer sigma values.

6. The method of claim 1, where a cluster comprises at least one source pixel and the at least one contingent intensity condition comprises a condition that solutions using large illuminated clusters are prioritized over solutions using multiple smaller, illuminated clusters.

7. An apparatus for illuminating a mask to project a desired image pattern into a photoactive material, the apparatus comprising:
   a receiver configured to receive an image pattern;
   a controller configured to determine a relationship between at least one source pixel in a set of source pixels to at least one desired intensity at at least one point in the image pattern, to impose at least one linear constraint on a set of intensity values based on at least one contingent intensity condition, where the at least one contingent intensity condition comprises at least one integer variable specifying at least one contingent constraint, and to determine values of the set of intensity values in accordance with the at least one linear constraint, using a constrained optimization algorithm; and
   an output configured to output the set of intensity values, where the set of intensity values represents intensities for the set of source pixels;
   where the at least one desired intensity at the at least one point in the image pattern is represented by a merit value of an image pattern at an extremum value determined by using a mixed integer linear programming algorithm configured to optimize the set of source pixels by constraining source pixels in defined zones to share common polarization orientations.

8. The apparatus of claim 7, further comprising an illumination source configured to receive the output at an illumination source and to illuminate a lithographic mask with light according to the set of intensity values.

9. The apparatus of claim 7, where the processor is configured to determine mask parameters for a mask to be illuminated by the set of source pixels, where the mask parameters and the values of the set of intensity values are determined simultaneously.

10. The apparatus of claim 7, where the values of the set of intensity values provide a synchronized n-pole source and where the at least one contingent intensity condition comprises a condition that the poles in the n-pole source have similar inner sigma values and similar outer sigma values.

11. The apparatus of claim 7, where a cluster comprises at least one source pixel and the at least one contingent intensity condition comprises a condition that solutions using large illuminated clusters are prioritized over solutions using multiple smaller, illuminated clusters.

12. A non-transitory computer readable storage medium having computer readable program code embodied therewith for illuminating a mask to project a desired image pattern into a photoactive material, the computer readable program code comprising instructions comprising:
   receiving an image pattern;
   determining a relationship between at least one source pixel in a set of source pixels to at least one desired intensity at at least one point in the image pattern;
   imposing at least one linear constraint on a set of intensity values based on at least one contingent intensity condition, where the at least one contingent intensity condition comprises at least one integer variable specifying at least one contingent constraint;
   determining values of the set of intensity values in accordance with the at least one linear constraint, using a constrained optimization algorithm; and
   outputting the set of intensity values, where the set of intensity values represents intensities for the set of source pixels;
   where the at least one desired intensity at the at least one point in the image pattern is represented by a merit value of an image pattern at an extremum value determined by using a mixed integer linear programming algorithm configured to optimize the set of source pixels by constraining source pixels in defined zones to share common polarization orientations.

13. The computer readable storage medium of claim 12, where the instructions further comprise: determining mask parameters for a mask to be illuminated by the set of source pixels, where the mask parameters and the values of the set of intensity values are determined simultaneously.

14. The computer readable storage medium of claim 12, where the values of the set of intensity values provide a synchronized n-pole source and where the at least one contingent intensity condition comprises a condition that the poles in the n-pole source have similar inner sigma values and similar outer sigma values.

15. An apparatus for illuminating a mask to project a desired image pattern into a photoactive material, the apparatus comprising:

means for receiving an image pattern;

means for determining a relationship between at least one source pixel in a set of source pixels to at least one desired intensity at at least one point in the image pattern;

means for imposing at least one linear constraint on a set of intensity values based on at least one contingent intensity condition, where the at least one contingent intensity condition comprises at least one integer variable specifying at least one contingent constraint;

means for determining values of the set of intensity values in accordance with the at least one linear constraint, using a constrained optimization algorithm; and means for outputting the set of intensity values, where the set of intensity values represents intensities for the set of source pixels;

where the at least one desired intensity at the at least one point in the image pattern is represented by a merit value of an image pattern at an extremum value determined by using a mixed integer linear programming algorithm configured to optimize the set of source pixels by constraining source pixels in defined zones to share common polarization orientations.

16. The apparatus of claim 15, further comprising means for receiving the output at an illumination source and for illuminating a lithographic mask with light according to the set of intensity values.

* * * * *